(12) United States Patent
Inoue et al.

(10) Patent No.: US 12,187,607 B2
(45) Date of Patent: Jan. 7, 2025

(54) METHOD FOR MANUFACTURING SEMICONDUCTOR SUBSTRATE, METHOD FOR MANUFACTURING DAMASCENE WIRING STRUCTURE, SEMICONDUCTOR SUBSTRATE, AND DAMASCENE WIRING STRUCTURE

(71) Applicant: HAMAMATSU PHOTONICS K.K., Hamamatsu (JP)

(72) Inventors: Nao Inoue, Hamamatsu (JP); Jo Ito, Hamamatsu (JP); Go Tanaka, Hamamatsu (JP); Atsuya Iima, Hamamatsu (JP); Daiki Suzuki, Hamamatsu (JP); Katsumi Shibayama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 666 days.

(21) Appl. No.: 17/288,642

(22) PCT Filed: Oct. 30, 2019

(86) PCT No.: PCT/JP2019/042668
§ 371 (c)(1),
(2) Date: Apr. 26, 2021

(87) PCT Pub. No.: WO2020/090930
PCT Pub. Date: May 7, 2020

(65) Prior Publication Data
US 2021/0403320 A1   Dec. 30, 2021

(30) Foreign Application Priority Data

Oct. 31, 2018 (JP) .................................. 2018-205351
Sep. 30, 2019 (JP) .................................. 2019-179964

(51) Int. Cl.
*B81C 1/00* (2006.01)
*B81B 7/00* (2006.01)

(52) U.S. Cl.
CPC ........ *B81C 1/00619* (2013.01); *B81B 7/0006* (2013.01); *B81B 2201/042* (2013.01);
(Continued)

(58) Field of Classification Search
CPC ........ B81C 1/00619; B81C 2201/0132; B81C 2201/0133; B81C 2201/0142;
(Continued)

(56) References Cited

U.S. PATENT DOCUMENTS 6,909,188 B2    6/2005  Akiyama
7,067,874 B2 *  6/2006  Nakamura .......... H01L 29/7397
                                                      257/329

(Continued)

FOREIGN PATENT DOCUMENTS

CN    108474938 A    8/2018
EP    2944998 A1    11/2015
(Continued)

OTHER PUBLICATIONS

Nilsson D. et al., "Fabrication of silicon molds for polymer optics", Journal of Micromechanics and Microengineering, Institute of Physics Publishing, Bristol, GB, vol. 13, No. 4, Jul. 1, 2003, p. 57-p. 61, XP020068938.
(Continued)

*Primary Examiner* — Kyoung Lee
(74) *Attorney, Agent, or Firm* — Faegre Drinker Biddle & Reath LLP

(57) ABSTRACT

A method of manufacturing a semiconductor substrate according to an embodiment includes a first step of forming a groove having a bottom surface and a side surface on which scallops are formed by performing a process includ-
(Continued)

ing isotropic etching on a main surface of a substrate, a second step of performing at least one of a hydrophilic treatment on the side surface of the groove and a degassing treatment on the groove, and a third step of removing the scallops formed on the side surface of the groove and planarizing the side surface by performing anisotropic wet etching in a state where the bottom surface of the recess is present.

9 Claims, 14 Drawing Sheets

(52) U.S. Cl.
CPC ... *B81B 2207/07* (2013.01); *B81C 2201/0132* (2013.01); *B81C 2201/0133* (2013.01); *B81C 2201/0142* (2013.01)

(58) Field of Classification Search
CPC ......... B81C 1/00095; B81C 2201/0112; B81C 2201/0138; B81C 2201/0181; B81C 1/00134; B81B 7/0006; B81B 2201/042; B81B 2207/07; B81B 3/0035; G02B 26/0841; G02B 26/101; G02B 26/085; H01L 21/30608; H01L 21/30655; H01L 23/535; H01L 21/743; H01L 21/3205
See application file for complete search history.

(56) References Cited

U.S. PATENT DOCUMENTS

| | | |
|---|---|---|
| 2001/0013617 A1 | 8/2001 | Toyoda et al. |
| 2004/0113238 A1 | 6/2004 | Hasunuma et al. |
| 2005/0037608 A1 | 2/2005 | Andricacos et al. |
| 2007/0190692 A1 | 8/2007 | Erturk et al. |
| 2007/0281474 A1 | 12/2007 | Suzuki et al. |
| 2008/0023846 A1 | 1/2008 | Seki et al. |
| 2008/0128907 A1 | 6/2008 | Yang et al. |
| 2012/0306007 A1* | 12/2012 | Yanagisawa ........ H01L 29/4236 438/270 |
| 2013/0181330 A1 | 7/2013 | Ramachandran et al. |
| 2014/0087562 A1* | 3/2014 | Ikarashi ................. H01J 37/12 438/697 |
| 2016/0105090 A1 | 4/2016 | Sadaharu et al. |
| 2018/0076141 A1 | 3/2018 | Wu et al. |
| 2018/0261501 A1 | 9/2018 | Tseng et al. |

FOREIGN PATENT DOCUMENTS

| | | |
|---|---|---|
| JP | H06-084896 A | 3/1994 |
| JP | 2007-200980 A | 8/2007 |
| JP | 2008-034508 A | 2/2008 |
| JP | 2009-524220 A | 6/2009 |
| JP | 2012-212797 A | 11/2012 |
| JP | 2013-504891 A | 2/2013 |
| JP | 2013-077631 A | 4/2013 |
| JP | 2013-206991 A | 10/2013 |
| JP | 2014-013821 A | 1/2014 |
| JP | 2014-063866 A | 4/2014 |
| JP | 2015-534261 A | 11/2015 |
| JP | 2017-092238 A | 5/2017 |
| JP | 2017-120851 A | 7/2017 |
| JP | 2018-093038 A | 6/2018 |
| WO | WO-2007/084879 A2 | 7/2007 |
| WO | WO-2011/033496 A1 | 3/2011 |
| WO | WO-2014/035820 A1 | 3/2014 |
| WO | WO-2017/150628 A1 | 9/2017 |
| WO | WO-2018/159077 A1 | 9/2018 |

OTHER PUBLICATIONS

Thomas Defforge et al., "Scalloping removal on DRIE via using low concentrated alkaline solutions at low temperature", Sensors and Actuators A: Physical, Elsevier BV, NL, vol. 170, No. 1, May 29, 2011, p. 114-p. 120, XP028273445.
International Preliminary Report on Patentability mailed May 14, 2021 for PCT/JP2019/042668.
International Preliminary Report on Patentability mailed May 14, 2021 for PCT/JP2019/042669.

* cited by examiner (a)

(b)

(c)

(a)

(b)

(a)

(b)

(a)

(b)

(a)

(b)

METHOD FOR MANUFACTURING SEMICONDUCTOR SUBSTRATE, METHOD FOR MANUFACTURING DAMASCENE WIRING STRUCTURE, SEMICONDUCTOR SUBSTRATE, AND DAMASCENE WIRING STRUCTURE

TECHNICAL FIELD

The present disclosure relates to a method of manufacturing a semiconductor substrate, a method of manufacturing a damascene wiring structure, a semiconductor substrate, and a damascene wiring structure.

BACKGROUND ART

Conventionally, as a process for producing a silicon substrate (semiconductor substrate) in which a recess is formed, there is known a process in which a recess is formed in a silicon substrate using a Bosch process, and then scallops (fine uneven structure) formed on a side surface of the recess is removed using dry etching (see Patent Documents 1 to 5).

CITATION LIST

Patent Document

[Patent Document 1] Japanese Unexamined Patent Application Publication No. 2013-206991
[Patent Document 2] Japanese Unexamined Patent Application Publication No. 2014-13821
[Patent Document 3] Japanese Unexamined Patent Application Publication No. 2008-34508
[Patent Document 4] U.S. Patent Application Publication No. 2008/0023846
[Patent Document 5] U.S. Patent Application Publication No. 2007/0281474

SUMMARY OF INVENTION

Technical Problem

For example, in an electromagnetically driven mirror to which the MEMS technology is applied (so-called MEMS mirror), in order to provide a low-resistance drive coil in a limited space in a movable portion, there is a case where it is desired to form a recess having high reliability (for example, a recess having a narrow pitch and a high aspect ratio and from which scallops are removed). The inventors of the present invention have found that, in the above-described case, using dry etching to remove the scallops formed on the side surface of the recess has the following problems. Specifically, when isotropic dry etching is used, the width of the recess on the opening side is increased, and it is not possible to realize a narrow pitch wiring (wiring embedded in the recess). Further, since it is difficult for the etching gas to reach the bottom of the recess, it is difficult to remove the scallops near the bottom of the recess. In addition, when anisotropic dry etching is used, only the bottom surface of the recess is easily etched, and thus it is difficult to appropriately remove the scallops formed on the side surface of the recess.

An object of one aspect of the present disclosure is to provide a semiconductor substrate having a recess with high reliability and a method of manufacturing the same, and a damascene wiring structure using the semiconductor substrate and a method of manufacturing the same.

Solution to Problem

A method of manufacturing a semiconductor substrate according to one aspect of the present disclosure includes a first step of forming a recess having a bottom surface and a side surface on which scallops are formed by performing a process including isotropic etching on a main surface of a semiconductor substrate, a second step of performing at least one of a hydrophilic treatment on the side surface of the recess and a degassing treatment on the recess, and a third step of removing the scallops formed on the side surface of the recess and planarizing the side surface by performing anisotropic wet etching in a state where the bottom surface of the recess is present.

In the method of manufacturing the semiconductor substrate, after forming the recess having the bottom surface and the side surface on which the scallops are formed, the side surface of the recess is subjected to the hydrophilic treatment or the degassing treatment, thereby improving the wettability of the side surface of the recess with the etchant. In addition, by performing anisotropic wet etching in a state where the bottom surface of the recess exists, the recess can be effectively filled with an etchant. Accordingly, the entire side surface of the recess can be wetted with the etching solution, and the scallops formed on the side surface can be effectively removed. Furthermore, since anisotropic etching is performed, the etching rate of the side surface can be made substantially uniform between the opening side and the bottom surface side of the recess. As a result, it is possible to suppress the occurrence of a problem that the width of the recess on the opening side is widened in a tapered shape. Therefore, according to the above manufacturing method, a semiconductor substrate having a recess with high reliability can be manufactured. That is, a recess in which an appropriate shape is maintained and the scallops are appropriately removed can be formed in the main surface of the semiconductor substrate.

A method of manufacturing a damascene wiring structure according to one aspect of the present disclosure includes the first step, the second step, and the third step of the method of manufacturing a semiconductor substrate, wherein in the first step, a groove extending along the main surface of the semiconductor substrate is formed as the recess. The method of manufacturing the damascene wiring structure further includes: a fourth step of forming an insulating layer having a first portion provided on an inner surface of the groove and a second portion formed integrally with the first portion and provided on the main surface after the third step; a fifth step of forming a metal layer on the first portion and the second portion of the insulating layer; a sixth step of forming a wiring portion on the metal layer embedded in the groove; a seventh step of removing the metal layer and the wiring portion on the second portion so that the second portion of the insulating layer is exposed; and an eighth step of forming a cap layer after the seventh step so that the cap layer covers the second portion of the insulating layer, the end portion of the metal layer, and the wiring portion.

If the insulating layer and the metal layer are formed in a state in which the scallops formed on the side surface of the recess is not sufficiently removed, a void may be generated between the insulating layer and the metal layer or a crack may be generated in the insulating layer. The voids may be structural weak points. In addition, the crack may cause current flowing through the wiring portion to leak to the semiconductor substrate. That is, a metal layer and a wiring portion formed on the insulating layer may contact a portion of the semiconductor substrate through the crack. Meanwhile, according to the above-described method of manufacturing the damascene wiring structure, the insulating layer and the metal layer are formed on the inner surface of the recess from which the scallops are appropriately removed. As a result, the occurrence of voids, cracks, or the like described above can be suppressed, and thus a highly reliable damascene wiring structure can be obtained.

The main surface of the semiconductor substrate may be along a (100) plane, and in the first step, the groove extending in a direction along the (110) plane may be formed. According to the above configuration, the bottom surface along the (100) plane and the side surface along the (110) plane are formed. Further, by utilizing the difference in etching rate depending on the plane orientation, it is possible to form an inclined surface along the (111) plane and inclined with respect to the bottom surface and the side surface between the bottom surface and the side surface. The angle of the corner between the bottom surface and the side surface when the inclined surface is formed (i.e., the angle between the bottom surface and the inclined surface or the angle between the side surface and the inclined surface) is greater than the angle of the corner when the inclined surface is not formed (i.e., the angle between the bottom surface and the side surface). That is, by forming the inclined surface, a more rounded corner portion (that is, a corner portion gently bent in a stepwise manner) is formed than in the case where the inclined surface is not formed. According to such a corner portion, it is possible to make it difficult for the insulating layer to crack at the corner portion. Therefore, according to the above configuration, a more reliable damascene wiring structure can be obtained.

A semiconductor substrate according to one aspect of the present disclosure includes a main surface provided with a recess, the recess having a bottom surface, a side surface, and an inclined surface. The inclined surface is connected to the bottom surface and the side surface between the bottom surface and the side surface, and is inclined with respect to the bottom surface and the side surface so as to form an obtuse angle with the bottom surface and the side surface.

In the semiconductor substrate, an angle of a corner portion between the bottom surface and the side surface (i.e., an angle between the bottom surface and the inclined surface or an angle between the side surface and the inclined surface) is larger than an angle of a corner portion when the inclined surface is not provided (i.e., an angle between the bottom surface and the side surface). That is, the inclined surface forms a corner portion that is more rounded (i.e., a corner portion that bends gradually) than in the case where the inclined surface is not formed. According to the recess having such a corner portion, for example, in a case where a predetermined material layer is provided on the inner surface of the recess, the occurrence of cracks in the material layer at the corner portion is suppressed. As described above, the reliability of the semiconductor substrate is improved by the recess. The semiconductor substrate can be obtained relatively easily by utilizing the difference in etching rate depending on the plane orientation.

A damascene wiring structure according to one aspect of the present disclosure includes the semiconductor substrate, an insulating layer, a metal layer, a wiring portion, and a cap layer. The recess is a groove extending along the main surface. The insulating layer has a first portion provided on an inner surface of the groove and a second portion formed integrally with the first portion and provided on the main surface. The metal layer is provided on the first portion of the insulating layer. The wiring portion is formed on the metal layer embedded in the groove. The cap layer is provided so as to cover the second portion of the insulating layer, an end of the metal layer, and the wiring portion.

The damascene wiring structure is formed by embedding the wiring portion or the like in the recess having the bottom surface, the side surface, and the inclined surface as described above. Therefore, cracks in the insulating layer are suppressed at the corners of the recess. Therefore, in the above-described damascene wiring structure, reliability is enhanced by the recess.

The bottom surface may be a surface along the (100) plane. The side surface may be a surface along the (110) plane. The inclined surface may be a surface along the (111) plane. According to the above configuration, by utilizing the difference in etching rate depending on the plane orientation, it is possible to easily obtain a damascene wiring structure having the above-described effects.

The recess may include a first groove extending in a first direction along the main surface and a second groove sharing the bottom surface with the first groove and extending in a second direction along the main surface intersecting the first direction. The first groove may have: a first side surface; and a first inclined surface connected to the bottom surface and the first side surface between the bottom surface and the first side surface, and inclined with respect to the bottom surface and the first side surface. The second groove may have: a second side surface; and a second inclined surface connected to the bottom surface and the second side surface between the bottom surface and the second side surface, and inclined with respect to the bottom surface and the second side surface. An intermediate surface may be formed between the first side surface and the second side surface and between the first inclined surface and the second inclined surface. The intermediate surface may be connected to the first side surface, the second side surface, the first inclined surface, the second inclined surface, and the bottom surface. An angle between the intermediate surface and each of the first side surface and the second side surface may be an obtuse angle. According to the above configuration, the angle of the corner where the first groove and the second groove intersect with each other (i.e., the angle between the intermediate surface and the first side surface or the angle between the intermediate surface and the second side surface) is larger than the angle of the corner when the intermediate surface is not formed (i.e., the angle between the first side surface and the second side surface). That is, by forming the intermediate surface, a more rounded corner portion (that is, a corner portion that is bent in a stepwise manner) is formed than in the case where the intermediate surface is not formed. According to such a corner portion, it is possible to effectively reduce stress acting on the wiring portion at the corner portion when vibration is applied to the semiconductor substrate. Therefore, according to the above configuration, a more reliable damascene wiring structure can be obtained.

Advantageous Effects of Invention

According to one aspect of the present disclosure, a semiconductor substrate having a recess with high reliability and a method of manufacturing the same, and a damascene wiring structure using the semiconductor substrate and a method of manufacturing the same can be provided.

DESCRIPTION OF EMBODIMENTS

Figure 1:
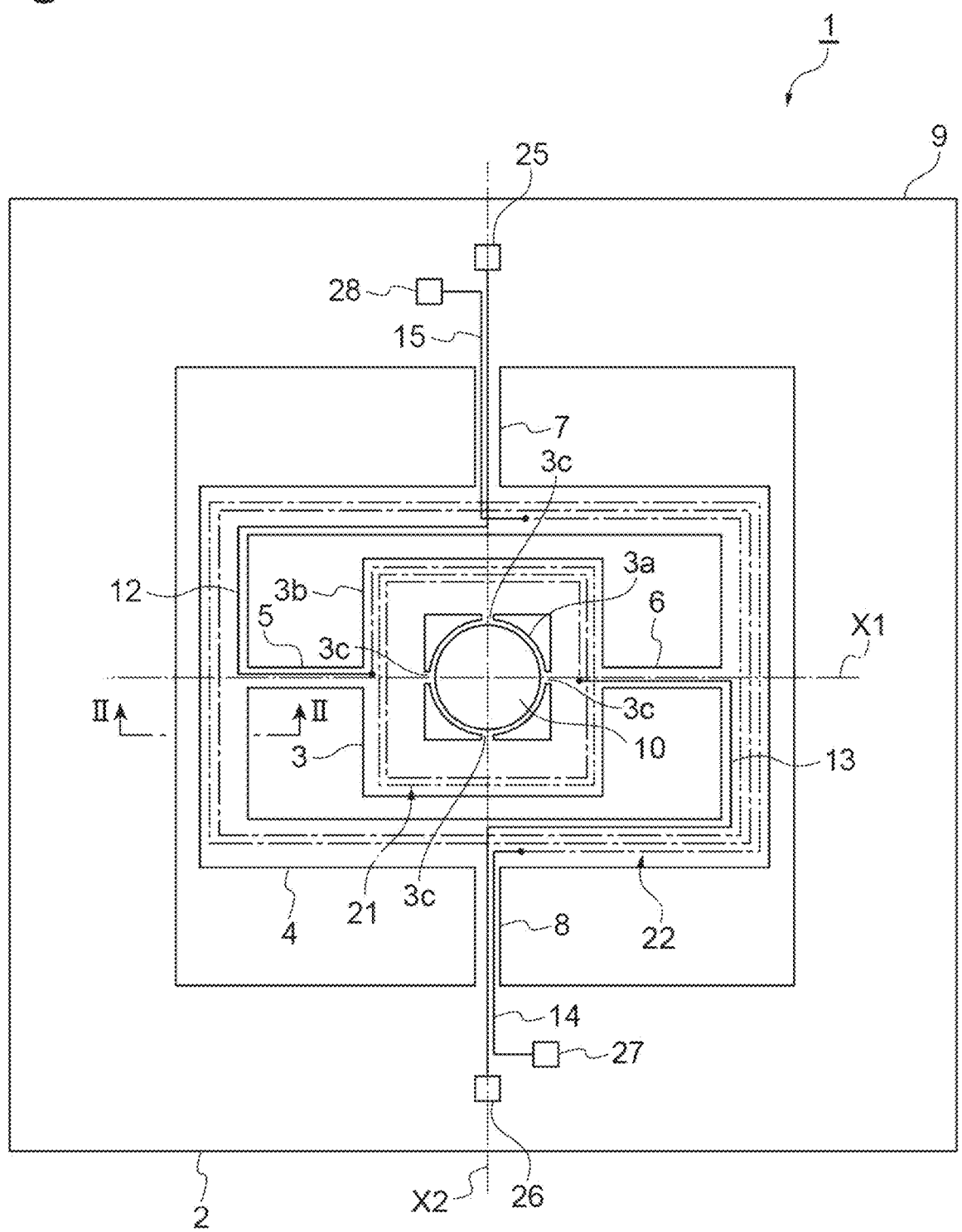
FIG. 1 is a plan view of a mirror device including a damascene wiring structure according to an embodiment.

Embodiments of the present disclosure will now be described in detail with reference to the accompanying drawings. In the description of the drawings, the same reference numerals are used for the same or equivalent element, and redundant description is omitted.

[Configuration of Mirror Device]

FIG. 1 is a plan view of a mirror device 1 (actuator device) including a damascene wiring structure 100 (see FIG. 2) according to an embodiment. As shown in FIG. 1, the mirror device 1 includes a support 2, a first movable portion 3, a second movable portion 4, a pair of first connection portions 5 and 6, a pair of second connection portions 7 and 8, and a magnetic field generation unit 9. The support 2, the first movable portion 3, the second movable portion 4, the first connection portions 5 and 6, and the second connection portions 7 and 8 are integrally formed by a semiconductor substrate (substrate 30). That is, the mirror device 1 is configured as a micro electro mechanical systems (MEMS) device.

In the mirror device 1, a first movable portion 3 including a mirror surface 10 is swung around a first axis X1 and a second axis X2 orthogonal to each other. The mirror device 1 can be used in, for example, an optical switch for optical communication, an optical scanner, or the like. The magnetic field generation unit 9 is configured by, for example, a permanent magnet arranged in a Halbach array or the like. The magnetic field generation unit 9 generates a magnetic field that acts on coils 21 and 22 described later.

The support 2 has, for example, a rectangular outer shape in plan view, and is formed in a frame shape. The support 2 is disposed on one side of the magnetic field generation unit 9 in a direction perpendicular to the mirror surface 10. The first movable portion 3 is disposed inside the support 2 in a state of being separated from the magnetic field generation unit 9. The "plan view" means a view from a direction perpendicular to the mirror surface 10, in other words, a view from a direction perpendicular to a main surface 31 of the substrate 30 described later.

The first movable portion 3 includes an arrangement portion 3a, a frame portion 3b surrounding the arrangement portion 3a, and a plurality of (four in this example) connection portions 3c connecting the arrangement portion 3a and the frame portion 3b to each other. The arrangement portion 3a is formed in, for example, a circular shape in plan view. For example, the mirror surface 10 of a circular shape is provided on the surface of the arrangement portion 3a opposite to the magnetic field generation unit 9. The mirror surface 10 is formed of a reflective film made of, for example, aluminum, an aluminum-based alloy, silver, a silver-based alloy, gold, or a dielectric multilayer film or the like.

The frame portion 3b has, for example, a rectangular outer shape in plan view and is formed in a frame shape. The plurality of connection portions 3c are arranged on both sides of the arrangement portion 3a on the first axis X1 and on both sides of the arrangement portion 3a on the second axis X2, and connect the arrangement portion 3a and the frame portion 3b to each other on the first axis X1 or the second axis X2.

The second movable portion 4 has, for example, a quadrangular outer shape in plan view and is formed in a frame shape. The second movable portion 4 is disposed inside the support 2 so as to surround the first movable portion 3 in a state of being separated from the magnetic field generation unit 9.

The first connection portions 5 and 6 are disposed on both sides of the first movable portion 3 on the first axis X1. Each of the first connection portions 5 and 6 connects the first movable portion 3 and the second movable portion 4 to each other on the first axis X1 so that the first movable portion 3 is swingable around the first axis X1. Each first connection portion 5 and 6 extends linearly along the first axis X1, for example.

The second connection portions 7 and 8 are disposed on both sides of the second movable portion 4 on the first axis X1. Each of the second connection portions 7 and 8 connects the second movable portion 4 and the support 2 to each other on the second axis line X2 so that the second movable portion 4 is swingable around the second axis line X2. Each of the second connection portions 7 and 8 extends linearly along the second axis X2, for example.

The mirror device 1 further includes coils 21 and 22, a plurality of wires 12, 13, 14, and 15, and a plurality of electrode pads 25, 26, 27, and 28. For example, the coil 21 is embedded in the frame portion 3b of the first movable portion 3 and extends in a spiral shape in plan view. For example, the coil 22 is embedded in the second movable portion 4 and extends in a spiral shape in plan view. Each coil 21 and 22 is made of a metal material such as copper.

The plurality of electrode pads 25, 26, 27, and 28 are provided on the support 2. The wiring 12 electrically connects one end of the coil 21 and the electrode pad 25. The wiring 12 extends from one end of the coil 21 to the electrode pad 25 via the first connection portion 5, the second movable portion 4, and the second connection portion 7. The wiring 13 electrically connects the other end of the coil 21 and the electrode pad 26. The wiring 13 extends from the other end of the coil 21 to the electrode pad 26 via the first connection portion 6, the second movable portion 4, and the second connection portion 8.

The wiring 14 electrically connects one end of the coil 22 and the electrode pad 27. The wiring 14 extends from one end of the coil 22 to the electrode pad 27 via the second connection portion 8. The wiring 15 electrically connects the other end of the coil 22 and the electrode pad 28. The wiring 15 extends from the other end of the coil 22 to the electrode pad 28 via the second connection portion 7.

In the mirror device 1 configured as described above, when a drive signal for linear operation is input to the coil 22 via the electrode pads 27 and 28 and the wirings 14 and 15, a Lorentz force acts on the coil 22 due to interaction with the magnetic field generated by the magnetic field generation unit 9. By using the balance between the Lorentz force and the elastic force of the second connection portions 7 and 8, the mirror surface 10 (the first movable portion 3) can be linearly moved together with the second movable portion 4 around the second axis X2.

On the other hand, when the drive signal of the resonance motion is input to the coil 21 via the electrode pads 25 and 26 and the wirings 12 and 13, the Lorentz force acts on the coil 21 by the interaction with the magnetic field generated by the magnetic field generation unit 9. In addition to the Lorentz force, by using the resonance of the first movable portion 3 at the resonance frequency, the mirror surface 10 (first movable portion 3) can be resonantly moved around the first axis X1.

[Damascene Wiring Structure]

Figure 2:
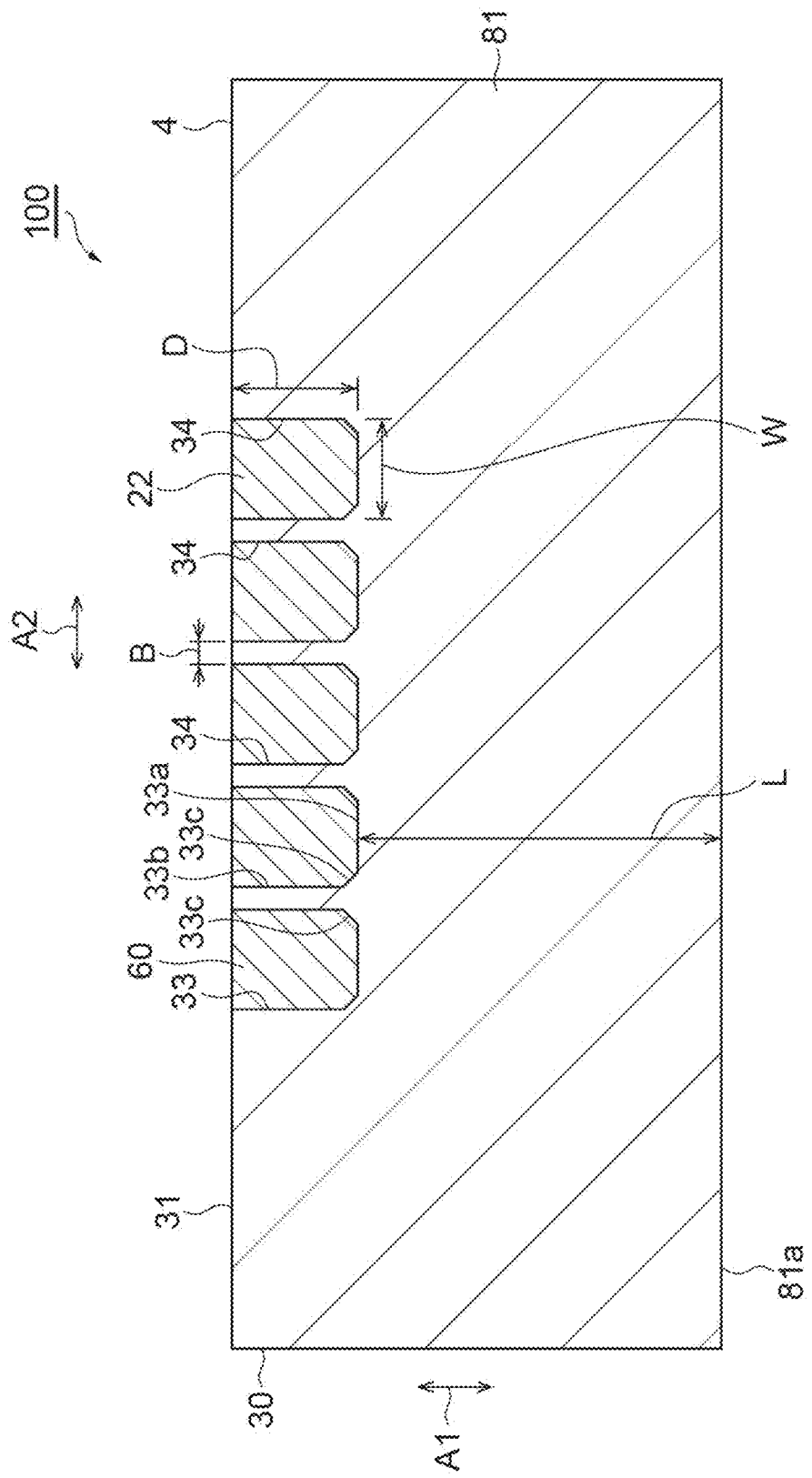
FIG. 2 is a cross-sectional view taken along line II-II of FIG. 1.
Figure 3:
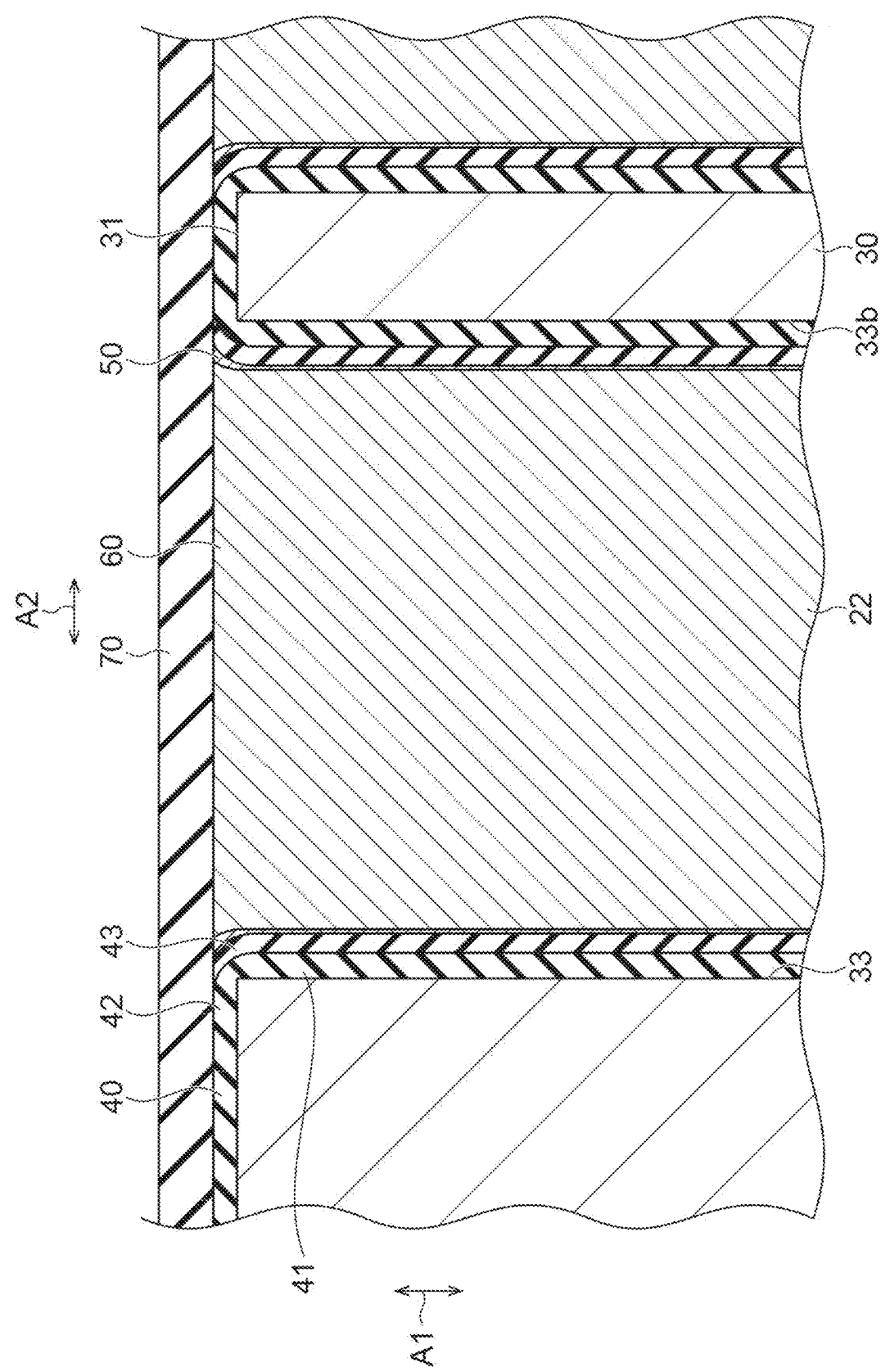
FIG. 3 is an enlarged view of FIG. 2.

The damascene wiring structure 100 of the coils 21 and 22 will be described with reference to FIGS. 2 to 4. Since the coils 21 and 22 have the same configuration, the coil 22 will be described below, and the description of the coil 21 will be omitted.

As described above, the coil 22 is provided in the second movable portion 4. The second movable portion 4 is constituted by, for example, the first silicon layer 81 of the substrate (base) 30. The substrate 30 is a semiconductor substrate such as a silicon on insulator (SOI) substrate, for example. The substrate 30 includes, for example, a first silicon layer 81, a second silicon layer 82, and an insulating layer 83 disposed between the first silicon layer 81 and the second silicon layer 82 (FIGS. 6 and 8 to 10). The support 2 is constituted by the first silicon layer 81, the second silicon layer 82, and the insulating layer 83. The first movable portion 3, the second movable portion 4, the first connection portions 5 and 6, and the second connection portions 7 and 8 are constituted by the first silicon layer 81. The substrate 30 has a main surface 31. In this example, the main surface 31 is a surface of the first silicon layer 81 opposite to the insulating layer 83.

The main surface 31 is provided with a groove 33 (a recess). The groove 33 has a shape corresponding to the coil 21, and extends in a spiral shape in plan view in this example. In a cross section perpendicular to the extending direction of the groove 33, the groove 33 has, for example, a rectangular shape. The inner surface of the groove 33 is constituted by a bottom surface 33a, a side surface 33b, and an inclined surface 33c connected to the bottom surface 33a and the side surface 33b. The inclined surface 33c is inclined with respect to the bottom surface 33a and the side surface 33b so as to form an obtuse angle (approximately 135 degrees in this embodiment) with the bottom surface 33a and the side surface 33b between the bottom surface 33a and the side surface 33b. Although only one cross section is shown in FIGS. 2 to 4, for example, the damascene wiring structure 100 is uniformly configured in the extending direction of the groove 33, and is similarly configured in any cross section perpendicular to the extending direction of the groove 33. However, the damascene wiring structure 100 does not necessarily have to be configured uniformly with respect to the extending direction of the groove 33.

The damascene wiring structure 100 includes an insulating layer 40, a metal layer 50, a wiring portion 60, and a cap layer 70 in addition to a substrate 30 as a base. The insulating layer 40 is provided over the main surface 31 and the inner surface (i.e., the bottom surface 33a, the side surface 33b, and the inclined surface 33c. The same shall apply hereinafter) of the groove 33. More specifically, the insulating layer 40 includes a first portion 41 provided on the inner surface of the groove 33 and a second portion 42 formed integrally with the first portion 41 and provided on the main surface 31. A boundary part 43 between the first portion 41 and the second portion 42 in the insulating layer 40 is located on a boundary part between the main surface 31 and the groove 33 in the substrate 30.

The insulating layer 40 includes a first layer 44 and a second layer 45. The first layer 44 is made of an oxide film and provided on the main surface 31 and the inner surface of the groove 33. The oxide film constituting the first layer 44 is, for example, a silicon oxide film ($SiO_2$) formed by thermally oxidizing silicon. The second layer 45 is made of a nitride film and provided on the first layer 44. The nitride film constituting the second layer 45 is, for example, a silicon nitride film (SiN) or the like. The first portion 41 and the boundary part 43 are constituted by the first layer 44 and the second layer 45, and the second portion 42 is constituted by the first layer 44.

The metal layer 50 is provided over the first portion 41 of the insulating layer 40. That is, the metal layer 50 is provided on the inner surface of the groove 33 via the first portion 41. The metal layer 50 is made of a metal material such as titanium (Ti). The metal layer 50 can function as, for example, a seed layer for stably forming the wiring portion 60 on the semiconductor substrate, and a barrier layer for preventing diffusion of metallic elements contained in the wiring portion 60 into the first silicon layer 81.

The wiring portion 60 is formed on the metal layer 50 embedded in the groove 33. That is, the wiring portion 60 is provided in the groove 33 via the first portion 41 of the insulating layer 40 and the metal layer 50. The wiring portion 60 is made of, for example, a metal material such as copper (Cu). The shape of the metal layer 50 in a cross section perpendicular to the extending direction of the wiring portion 60 (in other words, the extending direction of the groove 33) corresponds to the cross-sectional shape of the groove 33, and in this example, has a substantially rectangular shape. As in the present embodiment, when the wiring portion 60 extends spirally in plan view and the wiring portion 60 includes a first portion extending in a direction parallel to the first axis X1 and a second portion extending in a direction parallel to the second axis X2, the extending direction of the wiring portion 60 is a direction parallel to the first axis X1 in the first portion and a direction parallel to the second axis X2 in the second portion. Alternatively, when the wiring portion 60 extends in a curved shape or having curves, the extending direction of a certain portion of the wiring portion 60 may be a tangential direction of the portion.

The cap layer 70 is provided so as to cover the second portion 42 of the insulating layer 40, the end portion 51 of the metal layer 50, and the wiring portion 60. In this example, the cap layer 70 extends in a planar shape parallel to the main surface 31. The thickness T1 of the cap layer 70 is larger than the thickness T2 of the insulating layer 40. The cap layer 70 is made of, for example, a silicon nitride film and has an insulating property. That is, the cap layer 70 is made of the same material as the second layer 45 of the insulating layer 40.

Figure 4:
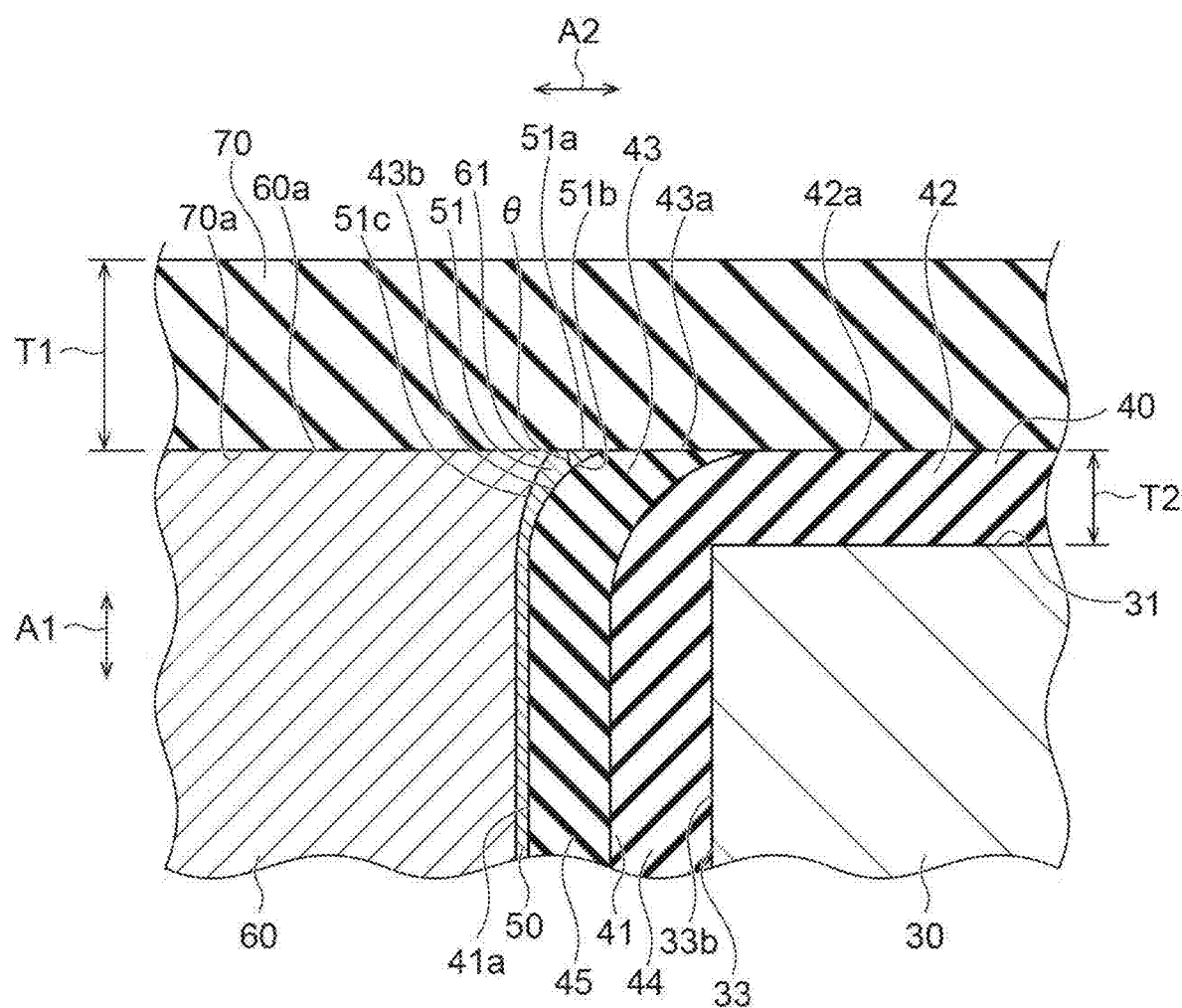
FIG. 4 is an enlarged view of FIG. 3.

As shown in FIG. 4, a surface 41a of the first portion 41 of the insulating layer 40 opposite to the substrate 30 is, for example, a flat surface perpendicular to the main surface 31. A surface 42a of the second portion 42 of the insulating layer 40 opposite to the substrate 30 is, for example, a flat surface parallel to the main surface 31. The surface 42a is in contact with the cap layer 70. In this embodiment, as an example, a surface 43a of the boundary part 43 opposite to the substrate 30 includes an inclined surface 43b inclined with respect to the direction A1 perpendicular to the main surface 31 when viewed from the extending direction of the wiring portion 60. More specifically, the inclined surface 43b is inclined outward with respect to the surface 41a of the first portion 41 (so as to be away from the center of the groove 33 as the distance from the bottom surface 34b of the groove 33 increases). In this example, the inclined surface 43b is curved convexly toward the side opposite to the substrate 30.

The end portion 51 of the metal layer 50 enters between the cap layer 70 and the inclined surface 43b. More particularly, the end portion 51 has a portion disposed in a space formed between the cap layer 70 and the inclined surface 43b in the direction A1 perpendicular to the main surface 31.

The end portion 51 has a first surface 51a, a second surface 51b continuous with the first surface 51a, and a third surface 51c continuous with the first surface 51a on a side opposite to the second surface 51b. The first surface 51a extends along the cap layer 70 and is joined to the cap layer 70. In this example, the first surface 51a is a flat surface and is positioned on the same plane as the surface 42a of the second portion 42 of the insulating layer 40 and the surface 60a of the wiring portion 60 described later.

The second surface 51b extends along the inclined surface 43b and is joined to the inclined surface 43b. Similarly to the inclined surface 43b, the second surface 51b is inclined outward with respect to the direction A1 perpendicular to the main surface 31. The second surface 51b is concavely curved toward the side opposite to the substrate 30. The second surface 51b is in contact with the second layer 45 constituting the boundary part 43 of the insulating layer 40. That is, a portion of the insulating layer 40 in contact with the second surface 51b (in this example, the second layer 45 constituting the boundary part 43) is made of the same material (silicon nitride film) as a portion of the cap layer 70 in contact with the first surface 51a. As described above, in this example, the entire cap layer 70 is formed of a silicon nitride film. This can increase the joining strength between the insulating layer 40 and the cap layer 70.

The third surface 51c is a surface opposite to the second surface 51b in the end portion 51. The third surface 51c is inclined outward with respect to the direction A1 when viewed from the extending direction of the wiring portion 60. The degree of inclination of the third surface 51c with respect to the direction A1 is gentler than the degree of inclination of the second surface 51b with respect to the direction A1. Accordingly, the thickness of the end portion 51 in the direction A2 parallel to the main surface 31 gradually increases toward the tip of the end portion 51. Apart 61 of the wiring portion 60 located at a boundary part between the metal layer 50 and the cap layer 70 enters between the cap layer 70 and the third surface 51c. To be more specific, the part 61 of the wiring portion 60 is disposed in a space formed between the cap layer 70 and the first surface 51c in the direction A1.

In the end portion 51, the first surface 51a and the second surface 51b form an acute angle. In other words, the angle θ formed by the first surface 51a and the second surface 51b is smaller than 90 degrees. That is, the thickness of the end portion 51 in the direction A1 perpendicular to the main surface 31 gradually decreases toward the tip of the end portion 51 (for example, the vertex formed by the first surface 51a and the second surface 51b). The angle θ may be, for example, 15 degrees to 88 degrees. The end portion 51 of the metal layer 50 is not provided on the second portion 42 of the insulating layer 40.

The thickness (minimum thickness) of the end portion 51 in the direction A2 parallel to the main surface 31 is larger than the thickness of a portion of the metal layer 50 other than the end portion 51 (for example, a portion of the metal layer 50 located in the middle in the direction A1 perpendicular to the main surface 31 or a portion of the metal layer 50 located on the first portion 41 of the insulating layer 40). The thickness (maximum thickness) of the tip portion of the metal layer 50 in the direction A1 is smaller than the thickness T2 of the insulating layer 40. Here, the "tip portion of the metal layer 50" means a portion of the metal layer 50 in which the thickness in the direction A2 parallel to the main surface 31 is larger than the thickness in the direction A1 perpendicular to the main surface 31.

In this example, a surface 60a of the wiring portion 60 that is in contact with the cap layer 70 is located on the same plane as the surface 42a of the second portion 42 of the insulating layer 40. The surface 42a is a surface of the insulating layer 40 in contact with the cap layer 70. A surface 70a of the cap layer 70 on the substrate 30 side is a flat surface.

As described above, the groove 33 extends in a spiral shape in plan view. Thus, as shown in FIG. 2, the groove 33 has a plurality of portions 34 adjacent to each other. The distance B between the portions 34 is smaller than the width W of the groove 33. The width W of the groove 33 is smaller than the depth D of the groove 33. The depth D of the groove 33 is, for example, a distance between the main surface 31 and the bottom surface 33a in the direction A1 perpendicular to the main surface 31. The distance L between the bottom surface 33a of the groove 33 in the direction A1 perpendicular to the main surface 31 and the opposite surface of the substrate 30 opposite to the main surface 31 is larger than the depth D of the groove 34. In this example, the opposite surface is the surface 81a of the first silicon layer 81 on the insulating layer 83 side (opposite to the main surface 31).

[Method of Manufacturing Damascene Wiring Structure]

Next, a method for producing the damascene wiring structure 100 (first step to eighth step) will be described with reference to FIGS. 5 to 10. The process of manufacturing the damascene wiring structure 100 includes a process of manufacturing a semiconductor substrate (substrate 30) having a groove 33 (first step to third step). In FIG. 6 and FIGS. 8 to 10, each part is schematically illustrated. In particular, in FIG. 8(b), FIG. 9(a), FIG. 9(b), FIG. 10(a), and FIG. 10(b), the inclined surface 33c is not shown, and the groove 33 is simplified.

Figure 5:
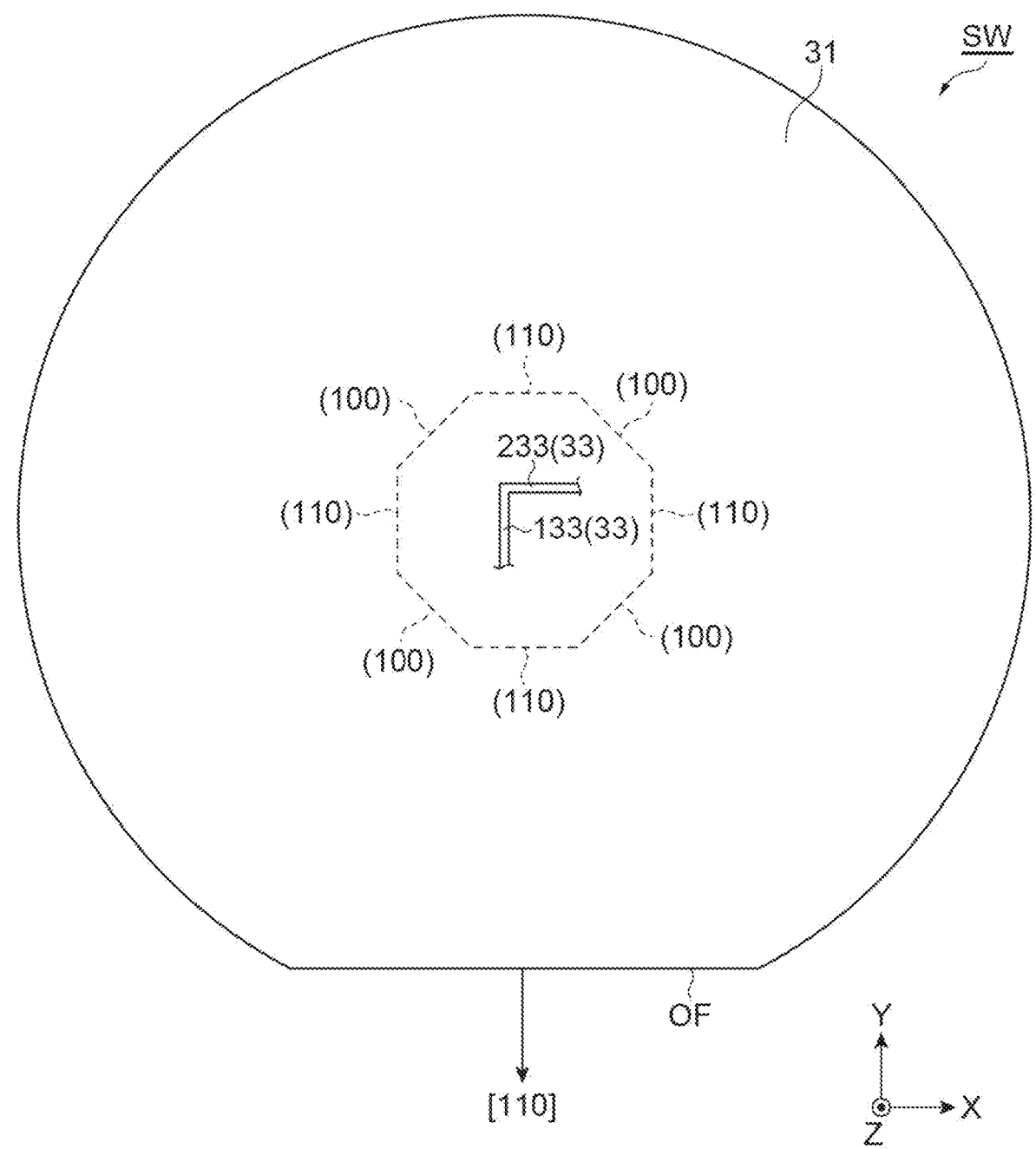
FIG. 5 is a plan view of an SOI wafer used for manufacturing a damascene wiring structure.
Figure 6:
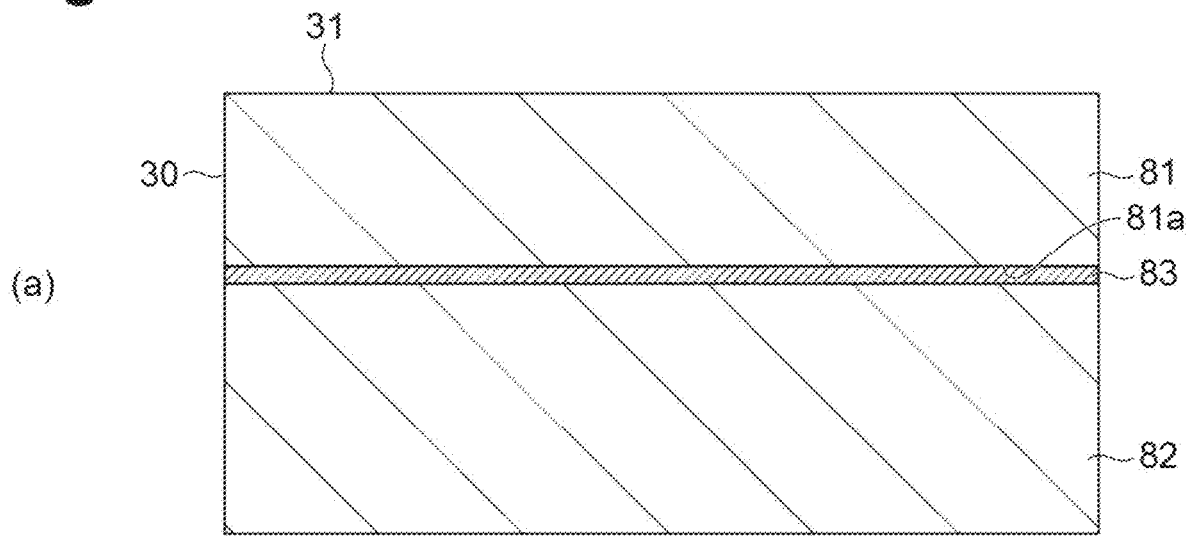
FIG. 6(a) is a view schematically showing the structure of the substrate before the groove is formed.
FIG. 6(b) is a view showing the cross-sectional shape of the groove formed in the first step.
FIG. 6(c) is a view showing the cross-sectional shape of the groove formed in the second step.
Figure 6:
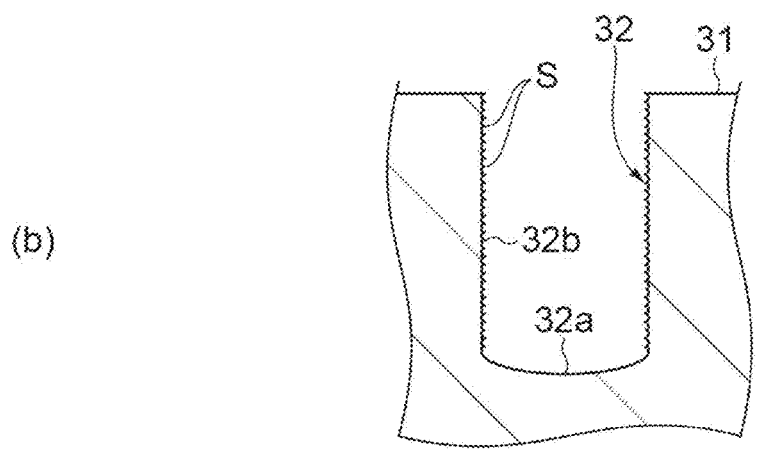
Figure 6:
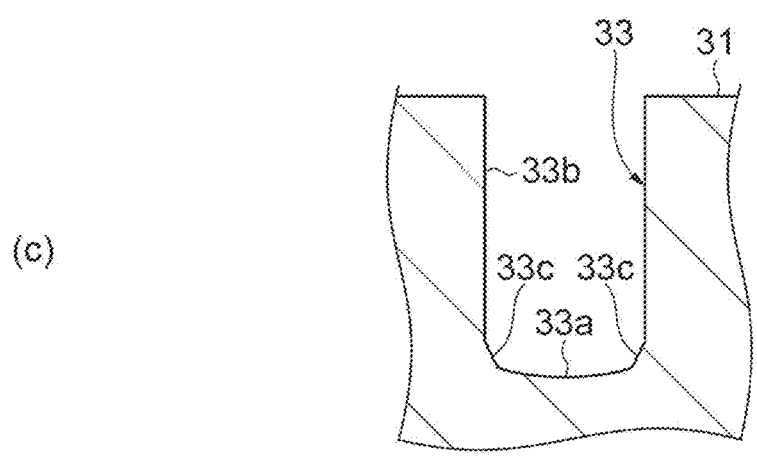
Figure 7:
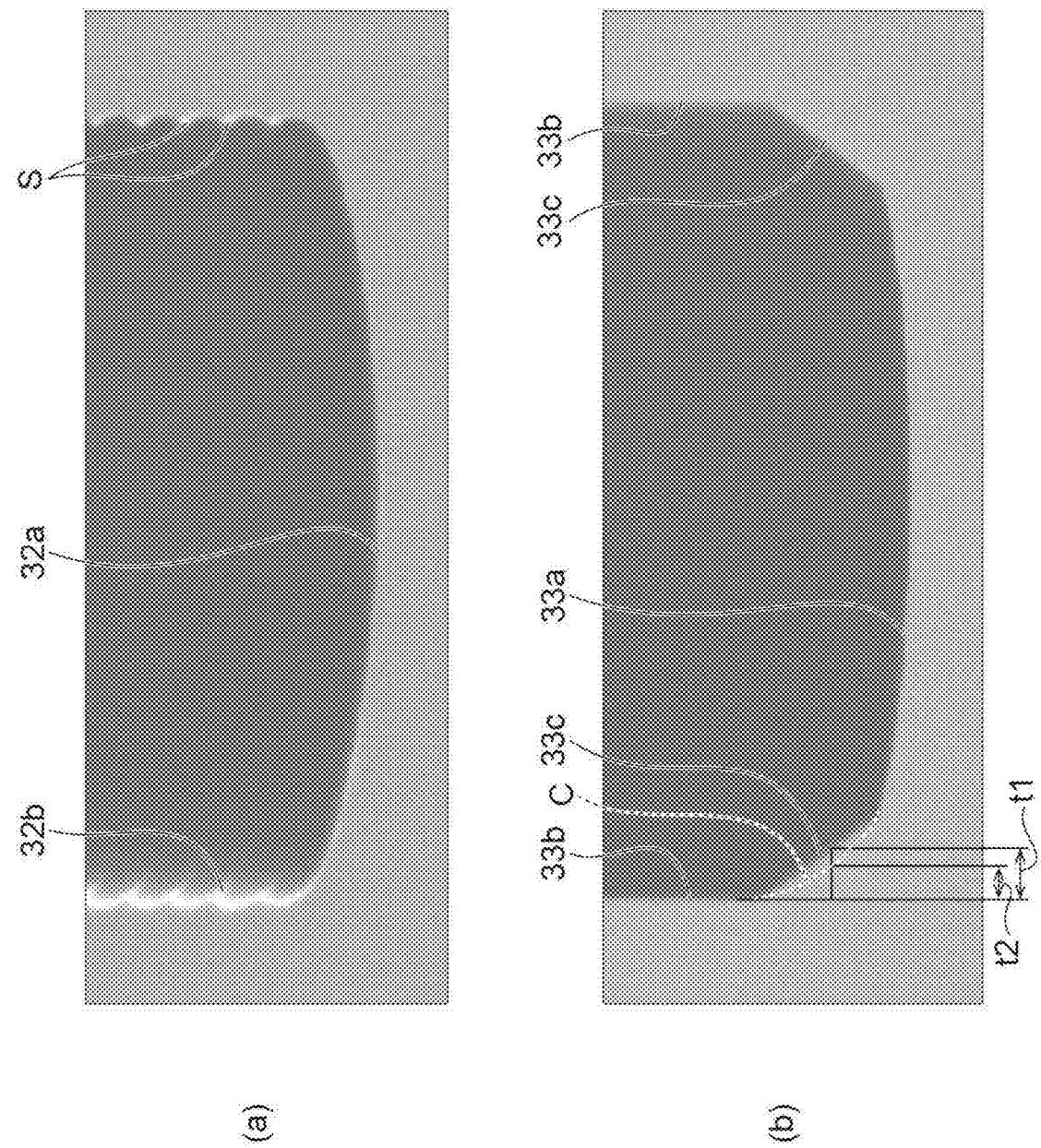
FIG. 7(a) is an SEM image of the bottom of the groove formed in the first step.
FIG. 7(b) is an SEM image of the bottom of the groove formed in the third step.
Figure 8:
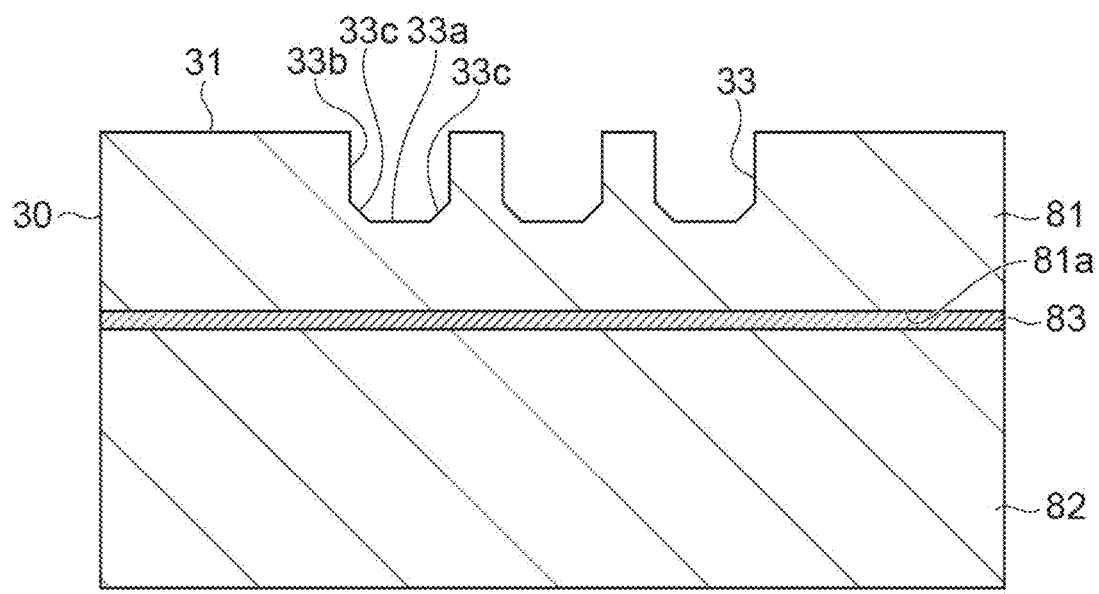
FIGS. 8(a) and 8(b) are cross-sectional views for explaining a method of manufacturing a damascene wiring structure.
Figure 8:
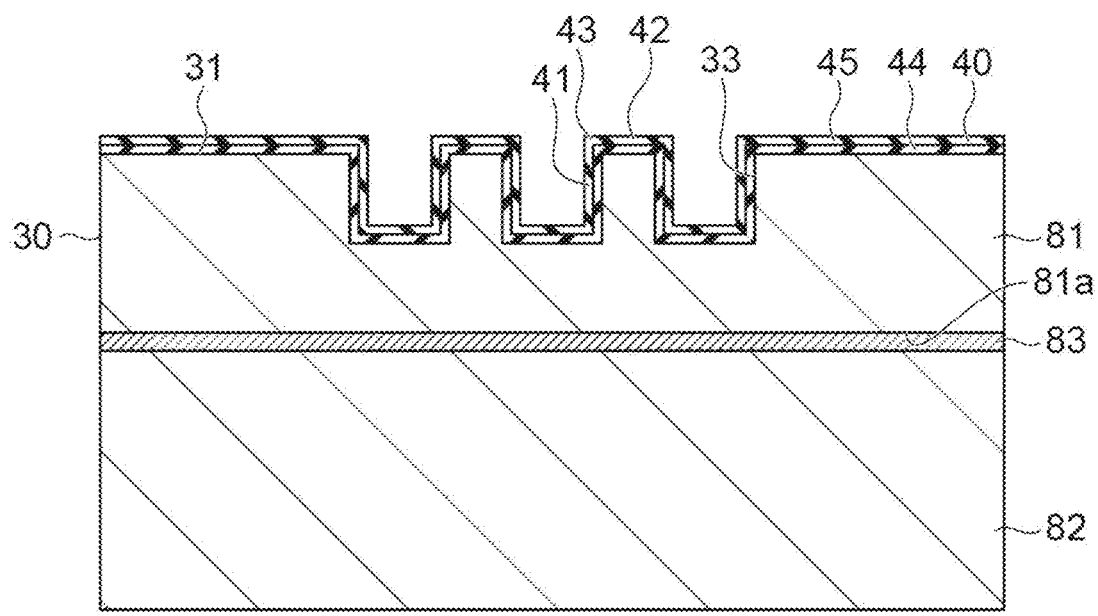
Figure 9:
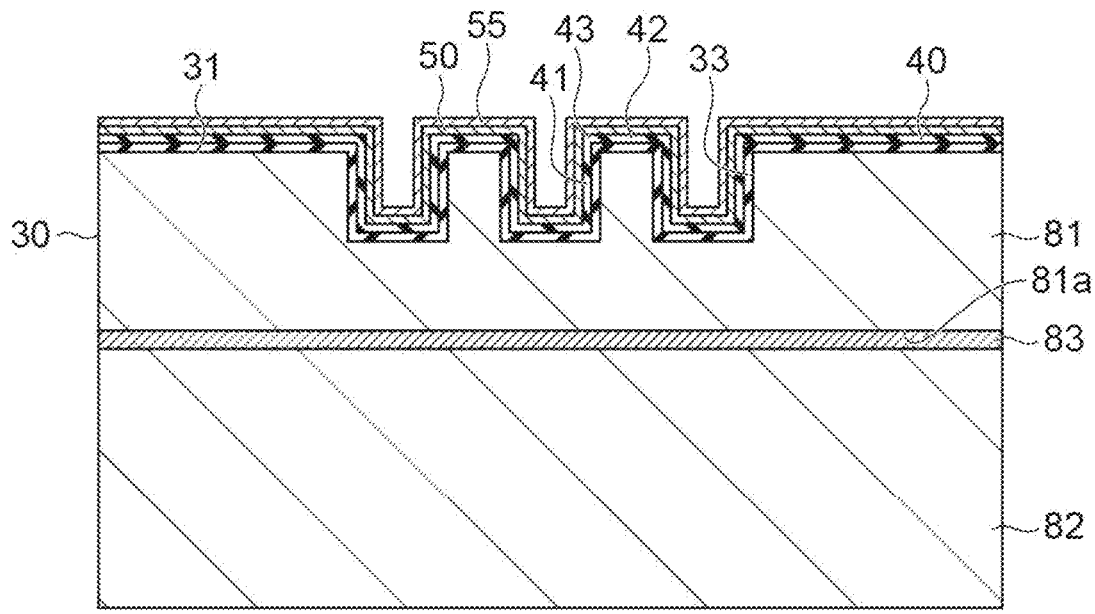
FIGS. 9(a) and 9(b) are cross-sectional views for explaining a method of manufacturing a damascene wiring structure.
Figure 9:
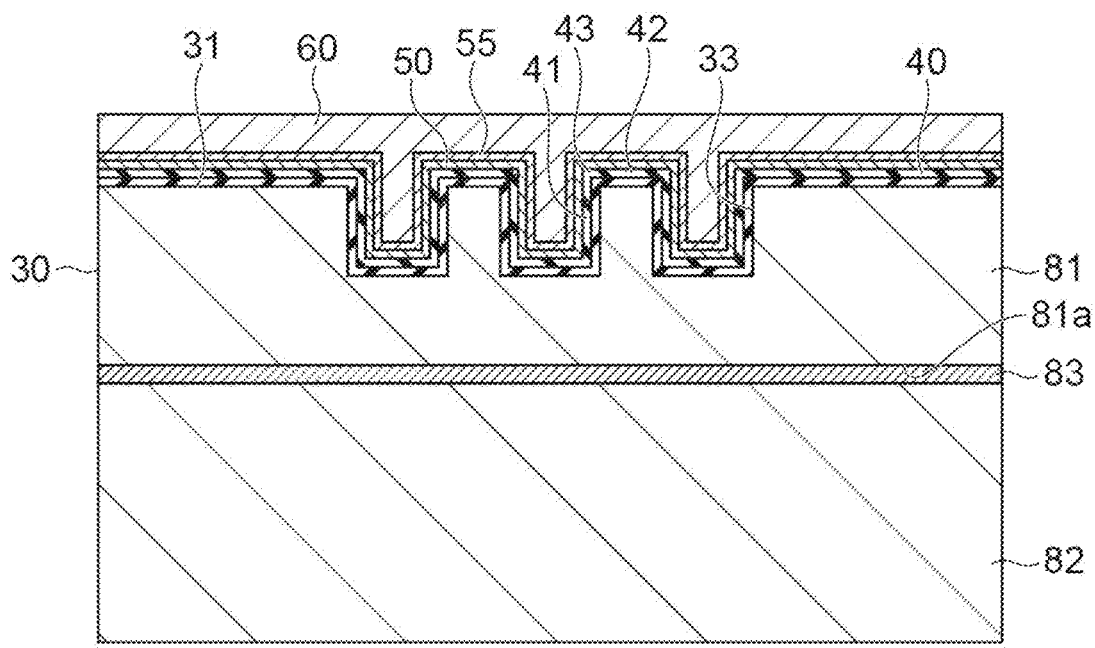
Figure 10:
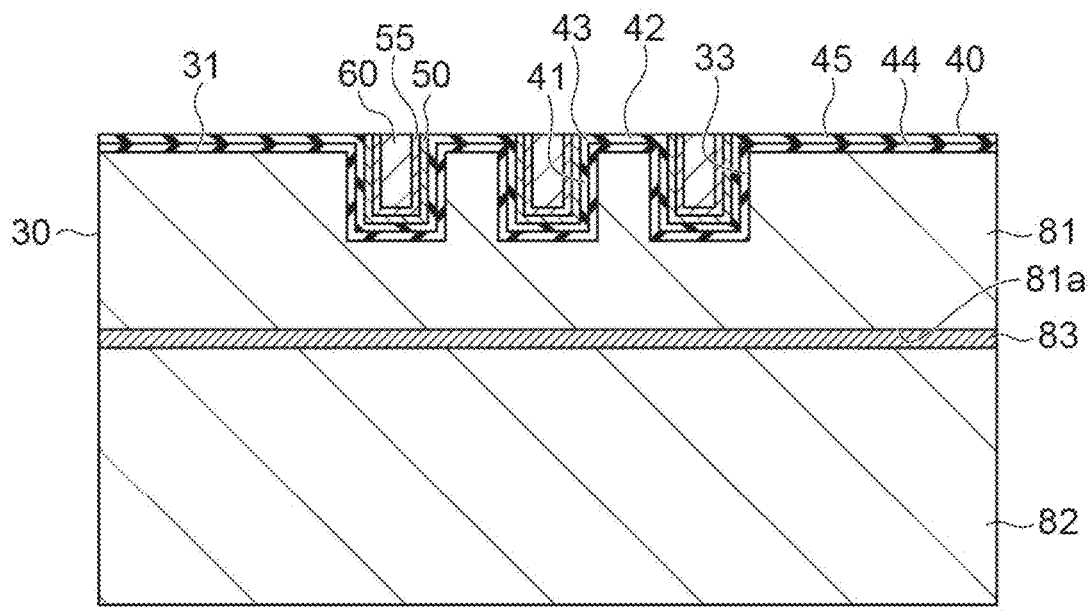
FIGS. 10(a) and 10(b) are cross-sectional views for explaining a method of manufacturing a damascene wiring structure.
Figure 10:
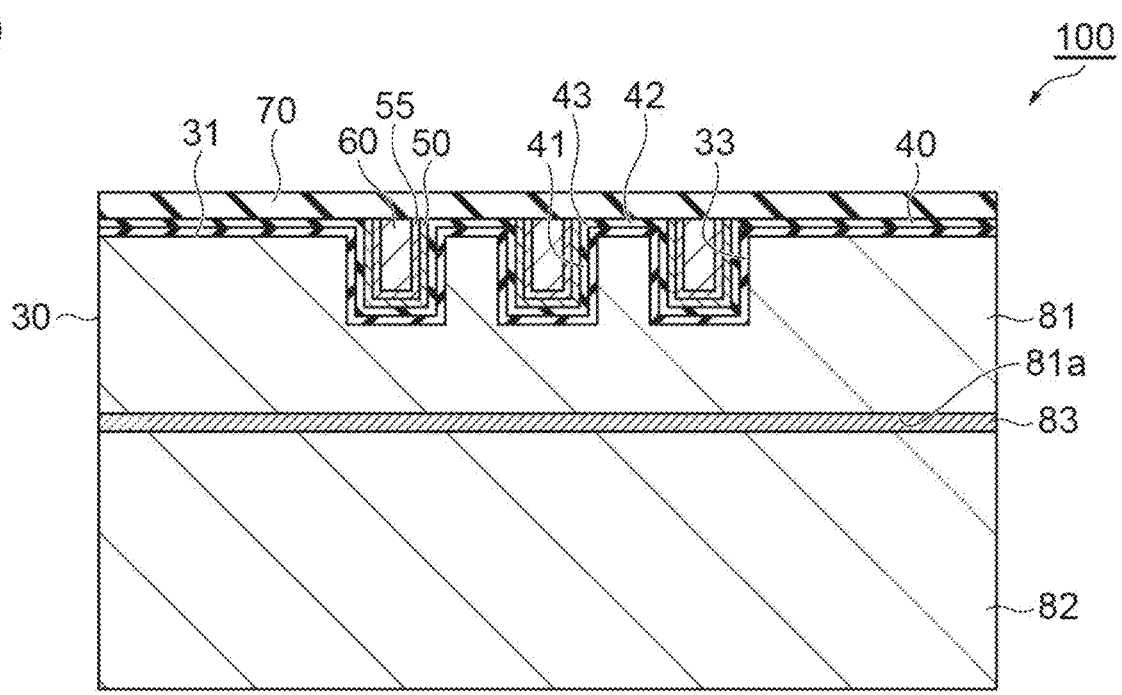

In the present embodiment, as an example, a substrate 30 having a groove 33 is manufactured from an SOI wafer SW as shown in FIG. 5. That is, the plurality of substrate 30 are obtained by cutting the SOI wafer SW into an appropriate shape. As shown in FIG. 6(a), the substrate 30 included in the SOI wafer SW includes a first silicon layer 81, a second silicon layer 82, and an insulating layer 83. The thickness of the first silicon layer 81 is, for example, about 30 to 150 μm, and the thickness of the second silicon layer 82 is, for example, about 625 μm.

The SOI wafer SW has an orientation flat OF which is a (110) plane and a main surface 31 which is a (100) plane. In FIG. 5, the Z-axis direction is a direction perpendicular to the main surface 31, the X-axis direction is a direction along the orientation flat OF when viewed from the Z-axis direction, and the Y-axis direction is a direction perpendicular to both the Z-axis direction and the X-axis direction. Here, the silicon crystal included in the SOI wafer SW is cubic. Therefore, in the example of FIG. 5, a plane parallel to a plane orthogonal to the Y-axis direction (XZ plane) and a plane orthogonal to the X-axis direction (YZ plane) constitute equivalent crystal planes (that is, (110) planes). In addition, any plane inclined by 45 degrees with respect to the (100) plane when viewed from the Z-axis direction constitutes an equivalent crystal plane (that is, the (100) plane). The X-axis direction corresponds to a direction parallel to one of the first axis X1 and the second axis X2 shown in FIG. 1, and the Y-axis direction corresponds to a direction parallel to the other of the first axis X1 and the second axis X2. Depending on the processing accuracy in manufacturing the SOI wafer SW, the crystal orientation of the orientation flat OF may not strictly coincide with (110). That is, the crystal orientations of the respective surfaces described above do not necessarily have to perfectly coincide with each other, and may include some deviation.

(First Step)

First, a process including isotropic etching is performed on the main surface 31 of the substrate 30. The "process including isotropic etching" is, for example, the Bosch process. In the Bosch process, a groove is formed by isotropic dry etching, and a protective film is formed on an inner wall of the groove. After only the protective film at the bottom of the groove is removed by anisotropic dry etching, the groove is formed again by isotropic dry etching. In the Bosch process, the groove is dug by repeating such processes. As a result, as shown in FIGS. 6(b) and 7(a), a groove 32 having a bottom surface 32a and a side surface 32b on which scallops are formed is formed. FIG. 6(b) shows a cross section perpendicular to the extending direction of the groove 32. FIG. 7(a) is an SEM image of the bottom of the groove 32 (a portion including the bottom surface 32a). The groove 32 is formed to extend in a direction parallel to the X-axis direction or the Y-axis direction. The scallops are a minute uneven structure formed on the side surface 32b.

As shown in FIG. 7(b), the bottom surface 33a, the side surface 33b, and the inclined surface 33c are integrally (continuously) formed. In the cross section perpendicular to the extending direction of groove 33, the length of the bottom surface 33a is longer than the length of the inclined surface 33c. Between the side surface 33b and the inclined surface 33c, there is formed a boundary line separating the side surface 33b and the inclined surface 33c. That is, the boundary between the side surface 33b and the inclined surface 33c is clear, and the corner portion between the side surface 33b and the inclined surface 33c is not a gentle curve (curved surface). The difference between the first angle formed by the bottom surface 33a and the inclined surface 33c and the second angle formed by the side surface 33b and the inclined surface 33c is 30 degrees or less. In the present embodiment, the first angle is an angle formed by the (100) plane and the (111) plane, and is approximately 125.3 degrees. The second angle is an angle formed by the (110) plane and the (111) plane, and is approximately 144.7 degrees. Therefore, the angle formed by the first angle and the second angle is approximately 19.4 degrees. The inclined surface 33c is a flat surface. Accordingly, at a predetermined height position, the thickness t1 of the substrate 33 increased by the formation of the inclined surface 33c is larger than the thickness t2 of the substrate 30 increased by the formation of the inclined surface if the inclined surface is the curved surface C (the curved surface recessed with respect to the space in the groove). Therefore, according to the inclined surface 33c which is a flat surface, since the thickness of the substrate 30 in the vicinity of the bottom surface 33a of the groove 33 can be suitably increased, the groove 33 can be structurally stabilized. The bottom surface 33a is curved at least more than the inclined surface 33c so as to be convex toward the side opposite to the opening side of the groove 33. Since the bottom surface 33a has such a curved shape, the bottom surface 33a and the inclined surface 33c are gently connected. As a result, concentration of stress on the corner portion between the bottom surface 33a and the inclined surface 33c can be suitably suppressed.

The scallops S inevitably occur because the grooves are formed by alternately repeating the isotropic dry etching, the formation of the protective film, and the anisotropic dry etching. When the fourth step and the subsequent steps are performed in a state in which the scallops S remain, there is a concern that a void may occur between the insulating layer 40 (second layer 45) and the metal layer 50 or a crack (rupture portion) may occur in the insulating layer 40. The void can be structural weak point in the damascene wiring structure 100. In addition, the crack may cause current flowing through the wiring portion 60 to leak into the substrate 30. That is, the metals (the metal layer 50 and the wiring portion 60) formed on the insulating layer 40 may come into contact with a part of the substrate 30 through the crack.

(Second Step and Third Step)

The second step and the third step are performed in order to avoid the above-described problems (i.e., occurrence of void, crack, or the like) caused by scallops S. First, hydrophilic treatment is performed on the side surface 32b of the groove 32 (second step). The hydrophilic treatment is, for example, a treatment of performing $O_2$ ashing on the side surface 32b or a treatment of immersing the side surface 32b in a surfactant, alcohol, or the like. Instead of (or in combination with) the hydrophilic treatment, the groove 32 may be subjected to degassing treatment. For example, a degassing treatment for degassing the solution present in the groove 32 may be performed. The degassing treatment is a treatment for facilitating the filling of the groove 32 with the etching solution, and is also a kind of hydrophilic treatment.

Subsequently, anisotropic wet etching is performed on the groove 32 containing scallops S in a state where the bottom surface 32a of the groove 32 is present (third step). As the etchant, for example, TMAH (tetramethylammonium hydroxide), KOH (potassium hydroxide), or the like is used. Here, "a state where the bottom surface 32a of the groove 32 is present" means a state where the groove 32 is a non-through hole (groove). That is, the "state where the bottom surface 32a of the groove 32 is present" is a state other than the state in which the bottom of the groove 32 is removed (that is, the state in which the groove 32 is a through hole penetrating from the main surface 31 to the surface of the second silicon layer 82 opposite to the insulating layer 83).

By performing the wet etching, the scallops S formed on the side surface 32b of the groove 32 are removed, and the side surface 32b is planarized. As a result, as shown in FIGS. 6(c) and 7(b), a groove 33 having a flat side surface 33b from which scallops S have been removed is obtained. FIG. 6(c) shows a cross section perpendicular to the extending direction of the groove 33. FIG. 7(b) is an SEM image of the bottom of the groove 33 (the portion including the bottom surface 33a). In the present embodiment, as shown in FIG. 5, a first groove 133 extending along the Y-axis direction (first direction) and a second groove 233 extending along the X-axis direction (second direction) are obtained as the groove 33. Further, from the relationship of the plane orientation shown in FIG. 5, in both of the first groove 133 and the second groove 233, the bottom surface 33a is formed by a surface along the (100) surface (that is, a surface substantially parallel to the (100) surface), and the side surface 33b is formed by a surface along the (110) surface (that is, a surface substantially parallel to the (110) surface). Further, the inclined surface 33c is formed by a surface along the (111) plane inclined by 54.7 degrees with respect to each of the (100) plane and the (110) plane (that is, a surface substantially parallel to the (111) plane). That is, the plane orientation of the bottom surface 33a, the plane orientation of the side surface 33b, and the plane orientation of the inclined surface 33c are different from each other. As described above, the groove 33 is different from the groove 32 not only in that the scallops S are removed but also in the shape of the corner portion of the bottom portion (i.e., the region where the bottom surface and the side surface are connected).

The shape of the inner surface of the groove 33 as described above is formed by the difference in etching rate depending on the plane orientation. Specifically, at the corner of the bottom of the groove 33, the etching rate in the direction perpendicular to the (111) plane is lower than the etching rate in the direction perpendicular to the (100) plane (i.e., the depth direction of the groove 33) and the etching rate in the direction perpendicular to the (110) plane (i.e., the width direction of the groove 33). As a result, the inclined surface 33c along the (111) plane is formed.

Although the above-described hydrophilic treatment or degassing treatment (second step) is performed before the third step of performing anisotropic wet etching, the degassing treatment (second step) for the groove 32 may be performed simultaneously with the wet etching in the third step, instead of (or in combination with) the hydrophilic treatment or the degassing treatment. The degassing treatment for the groove 32 is, for example, a treatment for removing a reactive gas (e.g., $H_2$) generated in the groove 32 by a reaction between the substrate 30 and the etching solution during wet etching or a gas (e.g., $CO_2$, $O_2$, $N_2$, etc.) dissolved in the etching solution in the groove 32 by using ultrasonic waves.

In addition, in order to appropriately adjust the difference in the etching rate between the plane orientations described above, a chemical liquid (for example, a surfactant NCW, IPA (isopropyl alcohol), or the like) that affects the anisotropy of the etching rate may be added to the etching liquid in the second step. Accordingly, the shape of the groove 33 (inclined surface 33c) can be appropriately adjusted.

As shown in FIG. 8(a), the substrate 30 having the groove 33 formed in the main surface 31 is obtained by the above-described processes of manufacturing a semiconductor device (the processes up to the third step). The depth of the groove 33 is, for example, about 5 to 30 μm.

(Fourth Step)

Subsequently, as shown in FIG. 8(b), an insulating layer 40 having a first portion 41 provided on the inner surface of the groove 33 and a second portion 42 formed integrally with the first portion 41 and provided on the main surface 31 is formed on the main surface 31 of the substrate 30. More specifically, after a first layer 44 made of a silicon oxide film (thermal oxide film) is formed on the main surface 31 and the inner surface of the groove 33, a second layer 45 made of a silicon nitride film (LP-SiN) is formed on the first layer 44. The thickness of the first layer 44 and the second layer 45 is, for example, about 100 to 1000 nm.

More specifically, in the first step, the insulating layer 40 is formed such that a surface 43a (a surface opposite to the substrate 30) of the boundary portion 43 between the first portion 41 and the second portion 42 in the insulating layer 40 includes an inclined surface 43b inclined with respect to a direction A1 perpendicular to the main surface 31 when viewed from the extending direction of the wiring portion 60 (see FIG. 4). For example, by forming the first layer 44 made of a silicon oxide film and the second layer 45 made of a silicon nitride film on the main surface 31 and the inner surface of the groove 33, the inclined surface 43b is formed on the surface 43a of the boundary portion 43. This is because the inclined shape is easily formed in the first layer 44 made of the silicon oxide film.

(Fifth Step)

Subsequently, as shown in FIG. 9(a), a metal layer 50 is formed on the first portion 41 and the second portion 42 of the insulating layer 40. In the fifth step, a metal layer 55 is formed on the metal layer 50. The metal layer 55 is made of a metal material such as copper, for example. The metal layer 55 functions as a seed layer together with the metal layer 50. The metal layer 50 and the metal layer 55 are formed by, for example, sputtering, but may be formed by atom layer deposition (ALD), chemical vapor deposition (CVD), ion-plating, or electroless plating. The total thickness of the metal layer 50 and the metal layer 55 is, for example, about 10 nm to 3000 nm.

(Sixth Step)

Subsequently, as shown in FIG. 9(b), a wiring portion 60 is formed on the metal layer 50 embedded in the groove 33. The wiring portion 60 is formed by plating, for example. The wiring portion 60 is formed, for example, such that the average thickness of the wiring portion 60 on the main surface 31 is 1 μm or more. In this example, since the metal layer 55 is made of the same material as the wiring portion 60, the wiring portion 60 and the metal layer 55 are integrated when the wiring portion 60 is formed, and the interface between the wiring portion 60 and the metal layer 55 may be eliminated. In this case, the metal layer 55 may be regarded as constituting the wiring portion 60.

(Seventh Step)

Subsequently, as shown in FIG. 10(a), the metal layer 50, the metal layer 55, and the wiring portion 60 on the second portion 42 are removed by, for example, chemical mechanical polishing (CMP) so that the second portion 42 of the insulating layer 40 is exposed. In the seventh step, the insulating layer 40, the metal layer 50, the metal layer 55, and the wiring portion 60 are subjected to chemical mechanical polishing from the side opposite to the substrate 30. A portion of each of the insulating layer 40, the metal layer 50, the metal layer 55, and the wiring portion 60 opposite to the main surface 31 or the bottom surface 31a in the direction A1 perpendicular to the main surface 33 is removed to planarize the insulating layer 40, the metal layer 50, the metal layer 55, and the wiring portion 60. At this time, in this example, a portion constituting the second portion 42 of the second layer 45 of the insulating layer 40 is removed.

(Eighth Step)

Subsequently, as shown in FIG. 10(b), a cap layer 70 is formed to cover the second portion 42 of the insulating layer 40, the end portion 51 of the metal layer 50, and the wiring portion 60. The cap layer 70 is made of, for example, a silicon nitride film (PE-SiN) and is formed to a thickness of about 200 to 3000 nm. Subsequently, the second silicon layer 82 and the insulating layer 83 are removed by etching or the like. Through the above steps, the above-described damascene wiring structure 100 is obtained.

[Effects]

In the above-described method of manufacturing a semiconductor substrate (first step to third step), after forming groove 33 having the bottom surface 33a and the side surface 32b on which scallops S are formed in the first step, the side surface 32b of the groove 32 is subjected to the hydrophilic treatment or the degassing treatment, thereby improving wettability of the side surface 32b of the groove 32 with the etchant. In addition, by performing anisotropic wet etching in a state where the bottom surface 32a of the groove 32 exists, the groove 32 can be effectively filled with the etching solution. Thus, the entire side surface 32b of the groove 32 can be wetted with the etching solution, and the scallops S formed on the side surface 32b can be effectively removed. That is, the groove 33 from which scallops S are removed is obtained. By removing the scallops S, structural weak points in the groove can be eliminated.

Furthermore, since anisotropic etching is performed in the third step, the etching rate of the side surface 32b can be made substantially uniform between the opening side and the bottom surface side of the groove 32. As a result, it is possible to suppress the occurrence of a problem that the width of the groove 32 on the opening side is widened in a tapered shape. Therefore, according to the above described method of manufacturing a semiconductor substrate, the substrate 30 having the groove 33 with high reliability can be manufactured. That is, the groove 33 in which an appropriate shape is maintained and the scallops S are appropriately removed can be formed in the main surface 31 of the substrate 30.

According to the above-described method of manufacturing a damascene wiring structure (the first step to the eighth step), the insulating layer 40 and the metal layer 50 are formed on the inner surface of the groove 33 from which the scallops S have been appropriately removed. As a result, it is possible to suppress the occurrence of voids, cracks, or the like described above, and thus it is possible to obtain the highly reliable damascene wiring structure 100. That is, as a result of forming the groove 33 with high reliability, the reliability of the damascene wiring structure 100 formed in the groove 33 can be improved.

As shown in FIG. 5, the main surface 31 of the substrate 30 extends along the (100) plane, and the groove 33 (the first groove 133 or the second groove 233) extending in the direction along the (110) plane (the X-axis direction or the Y-axis direction in this embodiment) is formed in the first step. According to the above configuration, the bottom surface 33a along the (100) plane and the side surface 33b along the (110) plane are formed. Further, by utilizing the difference in etching rate depending on the plane orientation, it is possible to form the inclined surface 33c along the (111) plane and inclined with respect to the bottom surface 33a and the side surface 33b between the bottom surface 33a and the side surface 33b. The angle of the corner between the bottom surface 33a and the side surface 33b when the inclined surface 33c is formed (i.e., the angle between the bottom surface 33a and the inclined surface 33c or the angle between the side surface 33b and the inclined surface 33c) is larger than the angle of the corner when the inclined surface 33c is not formed (i.e., the angle between the bottom surface 33a and the side surface 33b). In the present embodiment, the angle between the bottom surface 33a and the inclined surface 33c is approximately 125.3 degrees, and the angle between the side surface 33b and the inclined surface 33c is approximately 144.7 degrees. On the other hand, when the inclined surface 33c is not formed, the angle of the corner portion (that is, the angle formed by the bottom surface and the side surface) is approximately 90 degrees. That is, by forming the inclined surface 33c, a more rounded corner portion (i.e., a corner portion gently bent in a stepwise manner) is formed than in the case where the inclined surface 33c is not formed. According to such a corner portion, it is possible to make it difficult for the insulating layer 40 to crack at the corner portion. Therefore, according to the above configuration, a more reliable damascene wiring structure 100 can be obtained. That is, as a result of forming the groove 33 with higher reliability, the reliability of the damascene wiring structure 100 formed in the groove 33 can be further improved.

In the above-described substrate 30 (that is, the semiconductor substrate manufactured by the first to third steps), as described above, the angle of the corner portion between the bottom surface 33a and the side surface 33b is larger than the angle of the corner portion when the inclined surface 33c is not provided. That is, the inclined surface 33c forms a rounded corner portion (that is, a corner portion gently bent in a stepwise manner) as compared with the case where the inclined surface 33c is not formed. According to the groove 33 having such a corner portion, for example, in a case where a predetermined material layer (in the present embodiment, the insulating layer 40) is provided on the inner surface of the groove 33, the occurrence of cracks in the material layer at the corner portion is suppressed. As described above, the reliability of the substrate 30 is enhanced by the groove 33 described above. The substrate 30 can be obtained relatively easily by utilizing the difference in etching rate depending on the plane orientation.

The above-described damascene wiring structure 100 is formed by embedding the wiring portion 60 or the like in the groove 33 having the bottom surface 33a, the side surface 33b, and the inclined surface 33c as described above. Therefore, cracks in the insulating layer 40 are suppressed at the corners of the groove 33. Therefore, in the damascene wiring structure 100, reliability is enhanced by the groove 33.

In the damascene wiring structure 100, the bottom surface 33a is a surface along the (100) plane, the side surface 33b is a surface along the (110) plane, and the inclined surface 33c is a surface along the (111) plane. According to the above-described configuration, the damascene wiring structure 100 having the above-described effects can be easily obtained by utilizing the difference in etching rate depending on the plane orientation.

Figure 11:
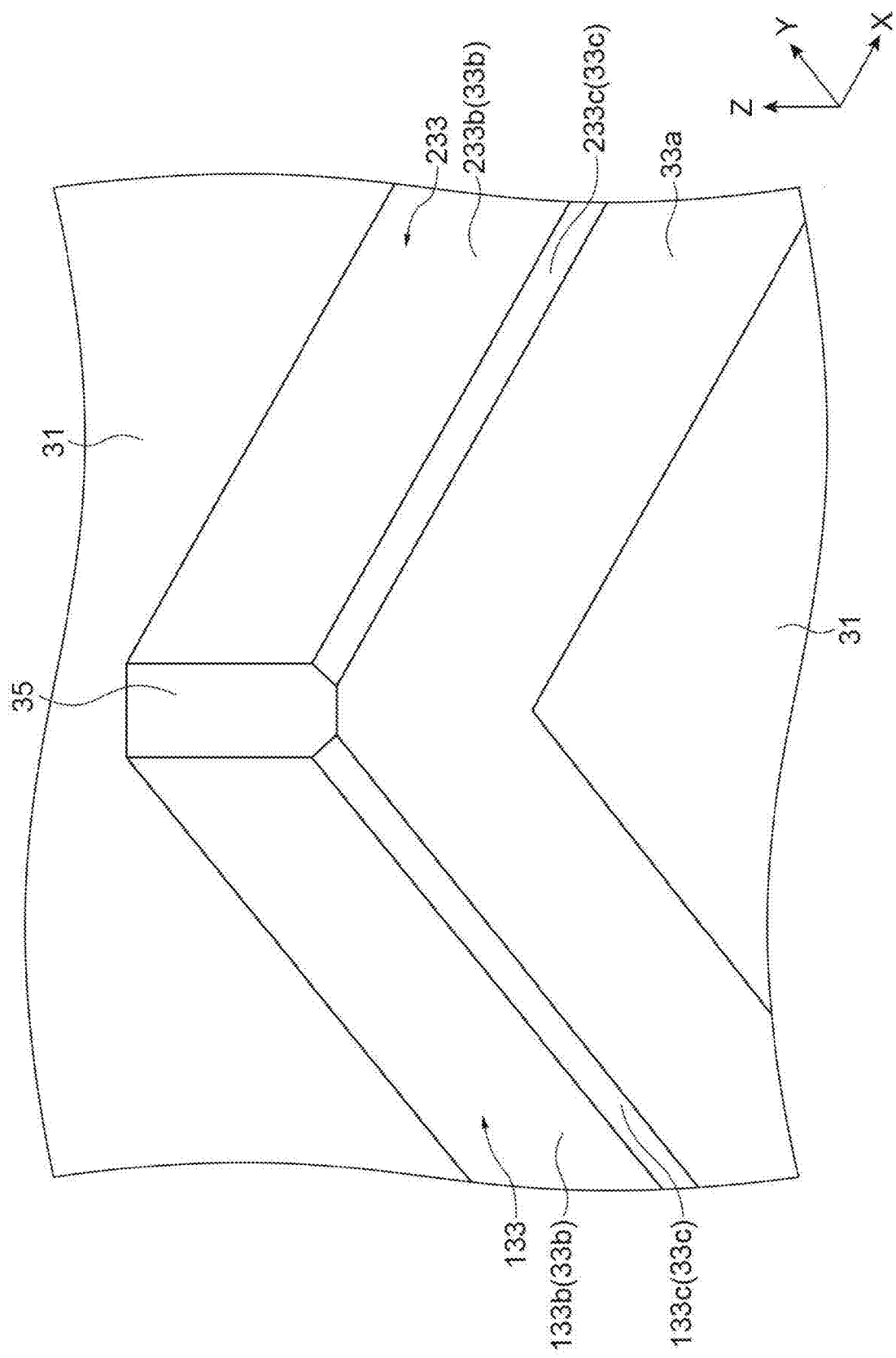
FIG. 11 is a perspective view schematically showing a corner portion of a damascene wiring structure.

FIG. 11 is a perspective view schematically showing a corner portion (that is, an outer corner portion where the first groove 133 and the second groove 233 intersect) of the damascene wiring structure 100. FIG. 11 illustrates a state before the damascene wiring structure 100 is formed (i.e., a state before the wiring portion 60 and the like are embedded in the first groove 133 and the second groove 233). As shown in FIG. 11, at the corner where the first groove 133 and the second groove 233 meet, the first groove 133 and the second groove 233 share the bottom surface 33a. That is, the bottom surface 33a of the first groove 133 and the bottom surface 33a of the second groove 233 are continuous at the corner portion.

The first groove 133 has a first side surface 133b and a first inclined surface 133c. The first inclined surface 133c is connected to the bottom surface 33a and the first side surface 133b between the bottom surface 33a and the first side surface 133b, and is inclined with respect to the bottom surface 33a and the first side surface 133b. As described above, in the present embodiment, the bottom surface 33a is along the (100) plane, the first side surface 133b is along the (110) plane, and the first inclined surface 133c is along the (111) plane. Therefore, an angle between the bottom surface 33a and the first inclined surface 133c is about 125.3 degrees, and an angle between the first side surface 133b and the first inclined surface 133c is about 144.7 degrees.

The second groove 233 has a second side surface 233b and a second inclined surface 233c. The second inclined surface 233c is connected to the bottom surface 33a and the second side surface 233b between the bottom surface 33a and the second side surface 233b, and is inclined with respect to the bottom surface 33a and the second side surface 233b. As described above, in the present embodiment, the bottom surface 33a is along the (100) plane, the second side surface 233b is along the (110) plane, and the second inclined surface 233c is along the (111) plane. Therefore, an angle between the bottom surface 33a and the second inclined surface 233c is about 125.3 degrees, and an angle between the second side surface 233b and the second inclined surface 233c is about 144.7 degrees.

An intermediate surface 35 is formed between the first side surface 133b and the second side surface 233b and between the first inclined surface 133c and the second inclined surface 233c. The intermediate surface 35 is connected to the first side surface 133b, the second side surface 233b, the first inclined surface 133c, the second inclined surface 233c, and the bottom surface 33a. The intermediate surface 35 extends along a (100) plane parallel to a direction (X-axis direction) perpendicular to the main surface 31 (see FIG. 5). The intermediate surface 35 is formed by the difference in etching rate depending on the plane orientation. Specifically, since the etching rate of the (100) plane is lower than that of the (110) plane, the intermediate surface 35 as the (100) plane is exposed. The angle between the intermediate surface 35 and the first side surface 133b and the angle between the intermediate surface 35 and the second side surface 233b are both obtuse angles. Specifically, each of the angles is substantially 135 degrees. The intermediate surface 35 may be a flat surface as shown in FIG. 11, or a portion of intermediate surface 35 between the first side surface 133b and the second side surface 233b may be inclined with respect to a portion of intermediate surface 35 between the first inclined surface 133c and the second inclined surface 233c. Further, the intermediate surface 35 does not necessarily have to be formed perpendicular to the bottom surface 33a, and the intermediate surface 35 may be inclined with respect to the bottom surface 33a.

According to the above configuration, the angle of the corner at which the first groove 133 and the second groove 233 intersect (i.e., the angle between the intermediate surface 35 and the first side surface 133b or the angle between the intermediate surface 35 and the second side surface 233b) is larger than the angle of the corner when intermediate surface 35 is not formed (i.e., the angle between the first side surface 133b and the second side surface 233b). In the present embodiment, the angle of the corner when the intermediate surface 35 is formed (i.e., the angle between the intermediate surface 35 and the first side surface 133b or the angle between the intermediate surface 35 and the second side surface 233b) is approximately 135 degrees, and the angle of the corner when the intermediate surface 35 is not formed is approximately 90 degrees. That is, by forming the intermediate surface 35, a corner portion that is more rounded (that is, a corner portion that is bent in a stepwise manner) than in the case where the intermediate surface 35 is not formed is formed. Such a corner portion can effectively reduce stresses acting on the wiring portion 60 at the corner portion when vibration is applied to the substrate or the like. Therefore, according to the above-described configuration, it is possible to obtain the damascene wiring structure 100 with further improved reliability. In particular, in a case where the damascene wiring structure 100 is applied to the mirror device 1 as in the present embodiment, since vibrations are frequently applied to the substrate 30 as the first movable portion 3 or the second movable portion 4 swings, the above-described configuration of the corner portion (that is, the configuration in which the intermediate surface 35 is formed) is particularly effective.

In the damascene wiring structure 100, the insulating layer 40 includes the first portion 41 provided on the inner surface of the groove 33 and the second portion 42 formed integrally with the first portion 41 and provided on the main surface 31, and the cap layer 70 is provided so as to cover the second portion 42 of the insulating layer 40, the end portion 51 of the metal layer 50, and the wiring portion 60. Accordingly, for example, compared to a case where the insulating layer 40 includes only the first portion 41, it is possible to reduce the number of portions on which stress is likely to concentrate. That is, when the insulating layer 40 includes only the first portion 41, the end portion of the insulating layer 40 is located in the vicinity of the boundary part between the main surface 31 and the groove 33, and the main surface 31 and the cap layer 70 are in contact with each other. In this case, the substrate 30, the end portion of the insulating layer 40, the end portion 51 of the metal layer 50, the wiring portion 60, and the cap layer 70 are in contact with each other at positions close to each other. Stress tends to concentrate on such a portion. On the other hand, in the damascene wiring structure 100, since the end portion of the insulating layer 40 is not present in the vicinity of the boundary part between the main surface 31 and the groove 33, it is possible to reduce the number of places where stress is concentrated. Further, the end portion 51 of the metal layer 50 extends so as to contact the cap layer 70. If the end portion 51 does not reach the cap layer 70 and remains at a position lower than the surface 60a of the wiring portion 60, a void may occur in a portion of the wiring portion 60 exposed from the metal layer 50. On the other hand, in the damascene wiring structure 100, the occurrence of such voids can be suppressed, and the peeling of the cap layer 70 or the like caused by the voids can be suppressed. Further, the surface 40a of the boundary part 43 between the first portion 41 and the second portion 42 opposite to the substrate 30 in the insulating layer 43 includes an inclined surface 43b, and the end portion 51 of the metal layer 50 enters between the cap layer 70 and the inclined surface 43b. In the end portion 51, the first surface 51a along the cap layer 70 and the second surface 51b along the inclined surface 43b form an acute angle. Accordingly, it is possible to suppress the stress from intensively acting on the cap layer 70. As described above, the reliability of the damascene wiring structure 100 is improved.

In the damascene wiring structure 100, the thickness T1 of the cap layer 70 is larger than the thickness T2 of the insulating layer 40. Accordingly, the strength of the cap layer 70 can be increased, and the reliability can be further increased.

In the damascene wiring structure 100, a portion of the cap layer 70 in contact with the first surface 51a of the end portion 51 and a portion of the insulating layer 40 in contact with the second surface 51b of the end portion 51 (the second layer 45 constituting the boundary part 43) are made of the same material. Accordingly, the joining strength between the cap layer 70 and the insulating layer 40 can be increased in the vicinity of the contact portion between the cap layer 70 and the end portion 51 of the metal layer 50, and the reliability can be further increased.

In the damascene wiring structure 100, the insulating layer 40 includes the first layer 44 made of an oxide film and the second layer 45 made of a nitride film and provided on the first layer 44. Accordingly, since the inclined shape can be easily formed in the first layer 44 made of the oxide film, the inclined surface 43b can be easily formed.

In the damascene wiring structure 100, the inclined surface 43b is convexly curved. Accordingly, it is possible to more reliably suppress the stress from intensively acting on the cap layer 70.

In the damascene wiring structure 100, the third surface 50c opposite to the second surface 51b in the end portion 51 of the metal layer 51 is inclined, and the part 61 of the wiring portion 60 enters between the cap layer 70 and the third surface 51c. Accordingly, the end portion 51 of the metal layer 50 can be pressed by the wiring portion 60, and the stress acting on the cap layer 70 from the metal layer 50 can be reduced. Further, since the thickness of the part 61 of the wiring portion 60 in the direction A1 perpendicular to the main surface 31 is reduced, the stress acting on the cap layer 70 from the wiring portion 60 can be reduced.

In the damascene wiring structure 100, the thickness of the end portion 51 of the metal layer 50 in the direction A2 parallel to the main surface 31 is larger than the thickness of the portion of the metal layer 50 other than the end portion 51. Accordingly, the contact area between the end portion 51 of the metal layer 50 and the cap layer 70 can be increased, and the stress acting on the cap layer 70 from the metal layer 50 can be more suitably dispersed.

In the damascene wiring structure 100, the thickness of the end portion 51 of the metal layer 50 in the direction A2 parallel to the main surface 31 gradually increases toward the tip of the end portion 51. Accordingly, the contact area between the end portion 51 of the metal layer 50 and the cap layer 70 can be further increased, and the stress acting on the cap layer 70 from the metal layer 50 can be further suitably dispersed.

In the damascene wiring structure 100, the groove 33 extends in a spiral shape. Even when the groove 33 extends in a spiral shape as described above, high reliability can be obtained.

In the damascene wiring structure 100, the interval B between the portions 34 adjacent to each other in the groove 33 may be smaller than the width W of the groove 33. As a result, the pitch (interval) of the wirings can be narrowed, and space saving can be achieved.

In the damascene wiring structure 100, the width W of the groove 33 is smaller than the depth D of the groove 33. This makes it possible to save space and reduce the resistance of wiring.

In the damascene wiring structure 100, the distance L between the bottom surface 33a of the groove 33 in the direction A1 perpendicular to the main surface 31 and the opposite surface (the surface 81a of the first silicon layer 81) of the substrate 30 opposite to the main surface 31 is larger than the depth D of the groove 34. Accordingly, the strength of the substrate 30 can be increased, and the reliability can be further increased.

Modification

Although the preferred embodiments of the present disclosure have been described in detail, the present disclosure is not limited to the above embodiments. The material and shape of each component are not limited to the examples described above. In the above embodiment, the damascene wiring structure 100 applied to the mirror device 1 has been described, but the damascene wiring structure 100 may be applied to a device other than the mirror device 1. In addition, in the above-described embodiment, the two axis type mirror device 1 that is rotatable about two axes (the first axis X1 and the second axis X2) is exemplified, but the damascene wiring structure 100 may be applied to a one axis type mirror device that is rotatable about one axis.

In the method of manufacturing a semiconductor substrate (first step to third step), trench-shaped grooves 32, 33 extending in the direction along main surface 31 are formed for the purpose of manufacturing damascene wiring structure 100, but in the first step to third step, for example, a via-shaped recess having a circular cross section or the like may be formed. Also in this case, the scallops formed on the side surface of the recess in the first step can be appropriately removed by wet etching in the third step. After the third step is performed, the bottom surface of the recess may be removed. For example, the bottom surface of the recess may be removed by performing polishing or the like from the surface of the second silicon layer 82 on the side opposite to the insulating layer 83 to form the through hole. Such a through hole can be used to embed a through electrode (metal), for example. When such a through-hole is formed, the inclined surface formed in the third step can be removed by polishing, and a through-hole that extends straight with an equal width and has no scallops can be obtained.

In the above embodiment, the SOI wafer SW having the orientation flat OF of the (110) plane is used. Therefore, the groove 33 is formed along the X-axis direction along the orientation flat OF or the Y-axis direction perpendicular to the orientation flat OF so that the side surface 33b of the groove 33 is along the (110) plane. However, the SOI wafer used for manufacturing the substrate 30 is not limited to the SOI wafer SW. For example, when an SOI wafer having an orientation flat OF of the (100) plane is used, the plane orientation of the SOI wafer is opposite to the plane orientation shown in FIG. 5. That is, the (100) plane shown in FIG. 5 becomes the (110) plane, and the (110) plane shown in FIG. 5 becomes the (100) plane. In this case, a groove having a side surface along the (110) plane can be formed by forming the groove along a direction inclined by 45 degrees with respect to the X-axis direction and the Y-axis direction. That is, even when an SOI wafer having a plane orientation different from that of the SOI wafer SW is used, a groove having a structure similar to that of the groove 33 can be formed by adjusting the design (extending direction) of the groove. In addition, in the SOI wafer SW, the crystal orientation of the first silicon layer 81 and the crystal orientation of the second silicon layer 82 may not necessarily coincide with each other.

Figure 12:
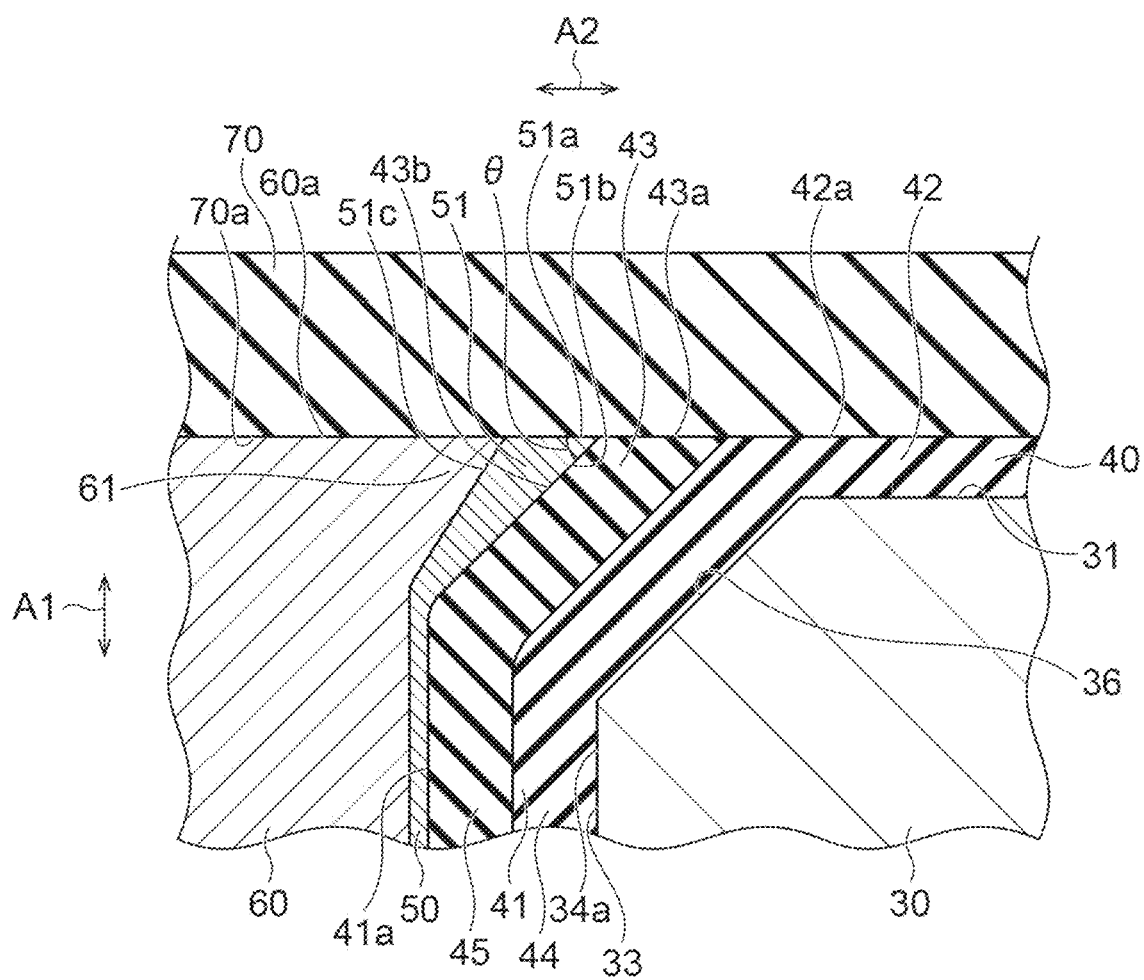
FIG. 12 is a cross-sectional view of a damascene wiring structure according to a first modification.

The damascene wiring structure 100 may be configured as in a first modification shown in FIG. 12. In the first modification, a boundary surface 36 inclined outward with respect to the direction A1 perpendicular to the main surface 31 when viewed from the extending direction of the wiring portion 60 is provided at a boundary part between the main surface 31 and the groove 33 in the substrate 30. The boundary surface 36 is, for example, a flat surface. Since the boundary part 43 of the insulating layer 40 is provided on the boundary surface 36, it extends along the boundary surface 36 and is inclined outward with respect to the direction A1 perpendicular to the main surface 31. The inclined surface 43b of the boundary part 43 and the second surface 51b of the end portion 51 of the metal layer 50 are flat surfaces parallel to the boundary surface 36. The third surface 51c of the end portion 51 is also a flat surface inclined outward with respect to the direction A1. The inclination angle of the third surface 51c with respect to the direction A1 is gentler than the inclination angle of the second surface 51b with respect to the direction A1. Accordingly, the thickness of the end portion 51 in the direction A2 parallel to the main surface 31 gradually increases toward the tip of the end portion 51.

In manufacturing the damascene wiring structure 100 of the first modification, for example, the groove 33 is formed by reactive ion etching using a non-Bosch process and a Bosch process. Accordingly, when the groove 33 is formed, the boundary surface 36 is formed at the boundary part between the main surface 31 and the groove 33 in the substrate 30. The reliability can be improved by combining the non-Bosch process and the Bosch process.

According to the first modification, the reliability can be improved as in the above-described embodiment. Further, since the boundary surface 36 is provided at the boundary part between the main surface 31 and the groove 33 in the substrate 30, the inclined surface 43b can be easily formed. Also in the first modification, the interval B between the portions 34 of the groove 33 may be smaller than the width W of the groove 33. In the case of the first modification, the interval B is a distance between the inner surfaces other than the boundary surface 36 in the plurality of portions 34 (in other words, a distance between portions of the inner surfaces of the groove 33 extending along the direction A1 perpendicular to the main surface 31).

Figure 13:
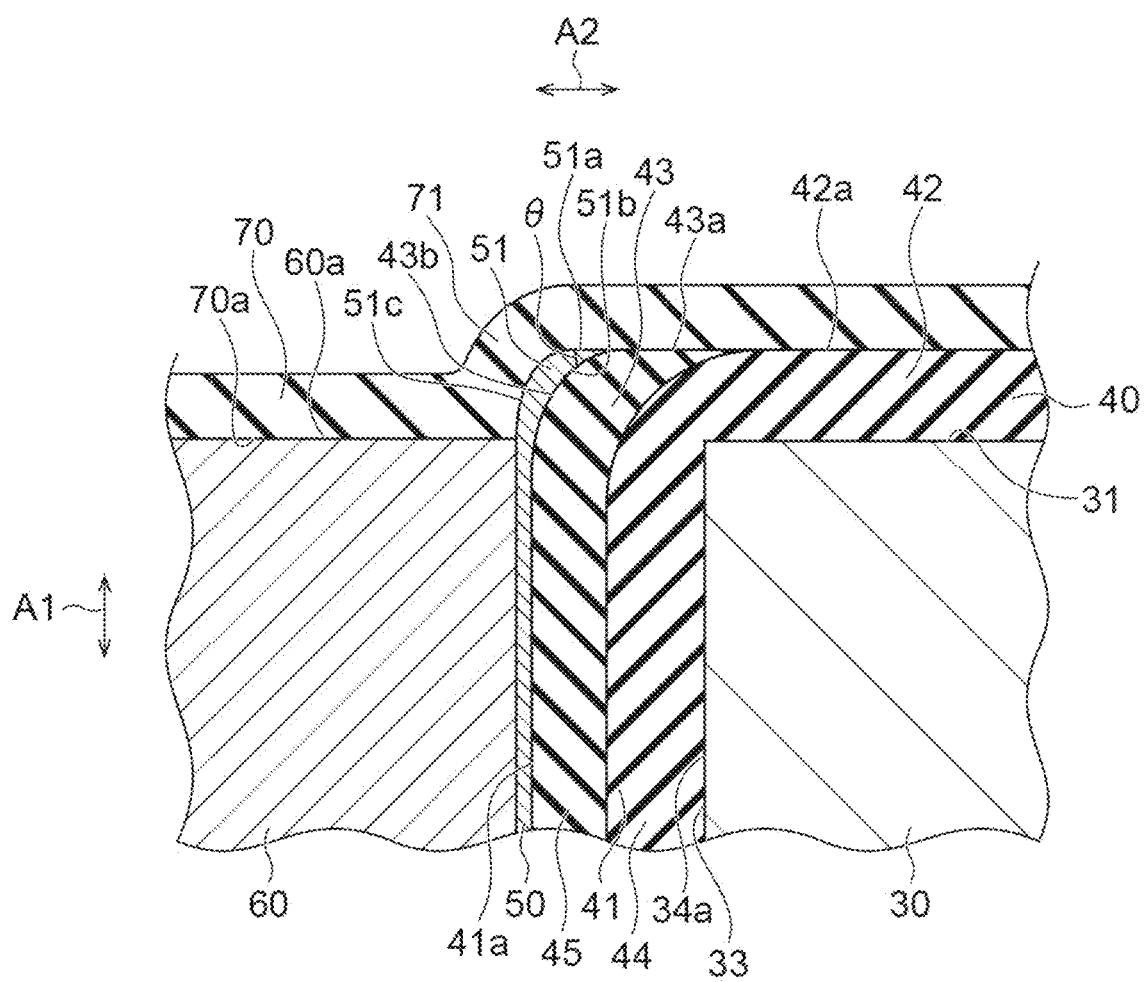
FIG. 13 is a cross-sectional view of a damascene wiring structure according to a second modification.

The damascene wiring structure 100 may be configured as in a second modification shown in FIG. 13. In the second modification, the surface 60a of the wiring portion 60 is located on the bottom surface 33a side of the groove 33 with respect to the surface 42a of the second portion 42 of the insulating layer 40. The third surface 51c of the end portion 51 of the metal layer 50 is covered by a boundary part 71 between a portion on the surface 60a and a portion on the surface 42a in the cap layer 70. The boundary part 71 extends along the third surface 51c and is inclined outward with respect to the direction A1 perpendicular to the main surface 31. In manufacturing the damascene wiring structure 100 of the second modification, for example, the amount of dishing of the wiring portion 60 (the amount of removal of the wiring portion 60) is increased by adjusting the slurry in the chemical mechanical polishing of the seventh step. Thus, the wiring portion 60 including the shape shown in FIG. 13 can be formed.

According to the second modification, the reliability can be improved as in the above embodiment. Further, the surface 60a is positioned on the bottom surface 33a side of the groove 33 with respect to the surface 42a. As a result, it is possible to further reduce the number of places where stress is likely to concentrate. Further, since the third surface 51c of the end portion 51 is covered by the boundary part 71, the contact area between the end portion 51 of the metal layer 50 and the cap layer 70 can be further increased, and the stress acting on the cap layer 70 from the metal layer 50 can be further suitably dispersed.

Figure 14:
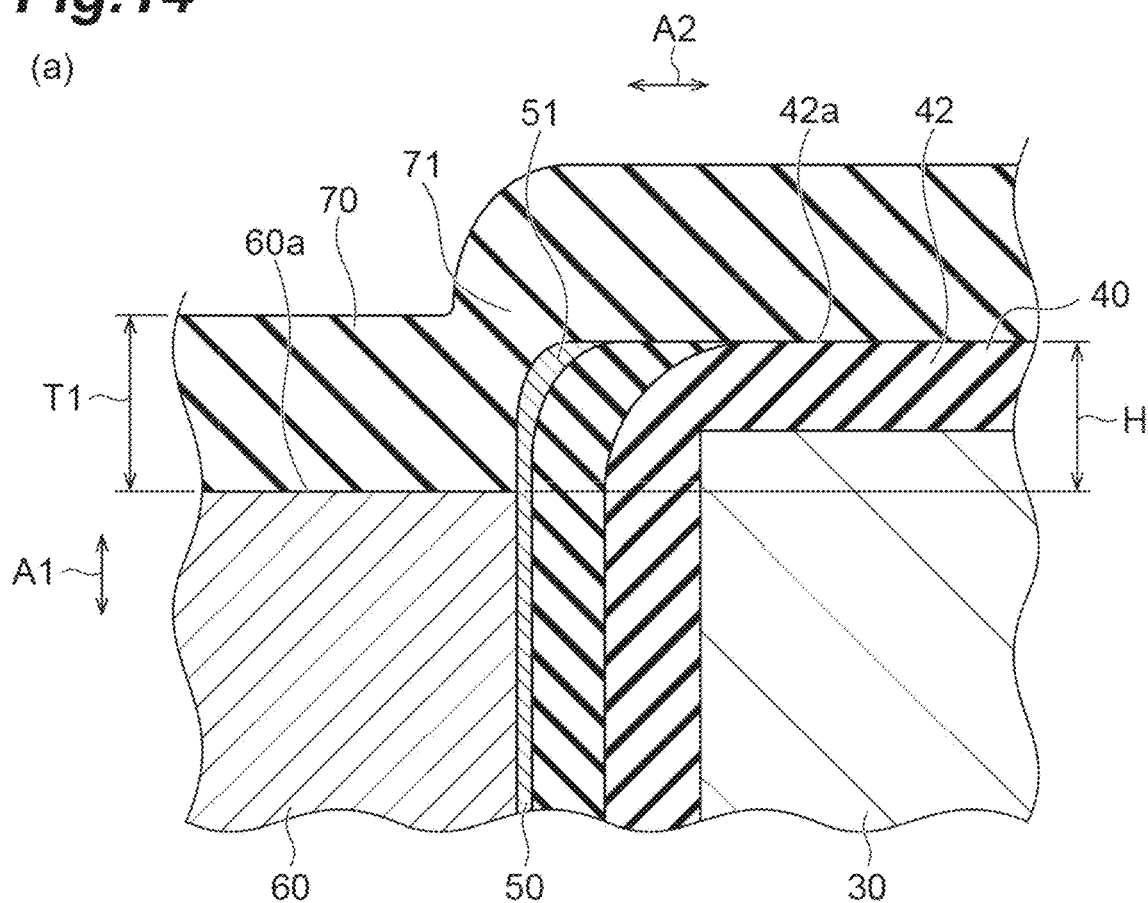
FIG. 14(a) is a cross-sectional view of a damascene wiring structure according to a third modification.
FIG. 14(b) is a cross-sectional view of a damascene wiring structure according to a fourth modification.
Figure 14:
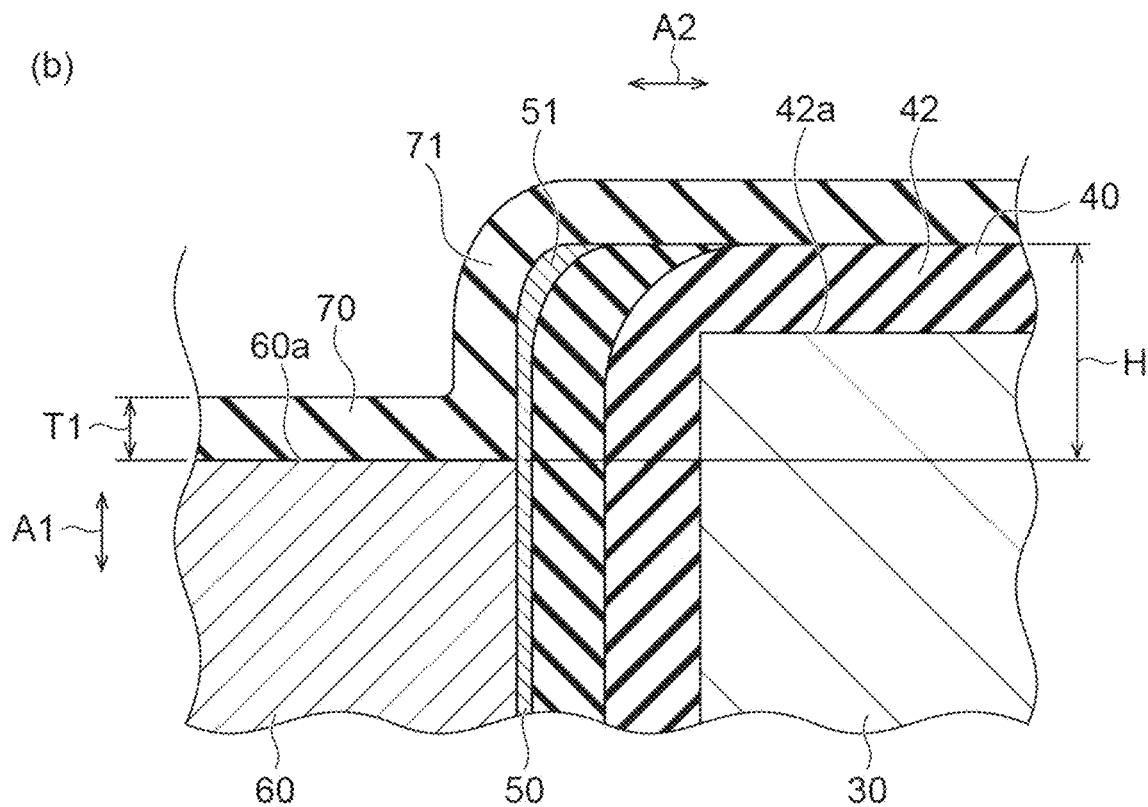

The damascene wiring structure 100 may be configured as in a third modification shown in FIG. 14(a). In the third modification, as in the second modification, the surface 60a of the wiring portion 60 is located on the bottom surface 33a side of the groove 33 with respect to the surface 42a of the second portion 42 of the insulating layer 40. The third surface 51c of the end portion 51 of the metal layer 50 is covered by the boundary part 71 of the cap layer 70. In the third modification, the thickness T1 of the cap layer 70 is larger than the distance H between the surface 60a and the surface 42a in the direction A1 perpendicular to the main surface 31. According to the third modification, the reliability can be improved as in the above embodiment. Further, since the thickness T1 of the cap layer 70 is larger than the distance H between the surface 60a and the surface 42a in the direction A1 perpendicular to the main surface 31, the strength of the cap layer 70 can be further increased.

The damascene wiring structure 100 may be configured as in a fourth modification shown in FIG. 14(b). In the fourth modification, as in the second modification, the surface 60a of the wiring portion 60 is located on the bottom surface 33a side of the groove 33 with respect to the surface 42a of the second portion 42 of the insulating layer 40. The third surface 51c of the end portion 51 of the metal layer 50 is covered by the boundary part 71 of the cap layer 70. In the fourth modification, the thickness T1 of the cap layer 70 is smaller than the distance H between the surface 60a and the surface 42a in the direction A1 perpendicular to the main surface 31. According to the fourth modification, the reliability can be improved as in the above embodiment. Further, since the thickness T1 of the cap layer 70 is smaller than the distance H between the surface 60a and the surface 42a in the direction A1 perpendicular to the main surface 31, the thickness of the wiring portion 60 in the direction A1 can be reduced, and as a result, the stress acting on the cap layer from the wiring portion 60 can be further reduced.

The third surface 51c of the end portion 51 of the metal layer 50 may extend along the second surface 51b. For example, the degree of inclination (inclination angle) of the third surface 51c may be the same as the degree of inclination (inclination angle) of the second surface 51b. The third surface 51c and the second surface 51b may extend parallel to each other. The second portion 42 may be constituted by the first layer 44 and the second layer 45. In this case, it is possible to further reduce the number of portions on which stress is likely to concentrate. When the cap layer 70 is formed of the same material as that of the second layer 45 of the insulating layer 40, the area of a portion where the same materials are bonded to each other is increased, and thus the adhesion can be increased. The insulating layer 40 may be constituted by a single layer. The insulating layer 40 may be formed of a single layer made of an oxide film, for example. In this case, the cap layer 70 may be formed of an oxide film. When viewed from the extending direction of the wiring portion 60, the first surface 51a and the second surface 51b may be connected to each other such that the curvatures thereof are continuous. The damascene wiring structure 100 may be applied to configurations other than actuator devices.

REFERENCE SIGNS LIST

30: substrate (semiconductor substrate), 31: main surface, 32, 33: groove, 32a, 33a: bottom surface, 32b, 33b: side surface, 33: groove (recess), 33c: inclined surface, 35: intermediate surface, 40: insulating layer, 41: first portion, 42: second portion, 50: metal layer, 51: end portion, 60: wiring portion, 70: cap layer, 100: damascene wiring structure, 133: first groove, 133b: first side surface, 133c: first inclined surface, 233: second groove, 233b: second side surface, 233c: second inclined surface, S: scallops.

The invention claimed is:

1. A method of manufacturing a semiconductor substrate, comprising:
   a first step of forming a recess having a bottom surface and a side surface on which scallops are formed by performing a process including isotropic etching on a main surface of a semiconductor substrate;
   a second step of performing at least one of a hydrophilic treatment on the side surface of the recess and a degassing treatment on the recess; and
   a third step of removing the scallops formed on the side surface of the recess and planarizing the side surface by performing anisotropic wet etching in a state where the bottom surface of the recess is present, wherein
   a protective film formed on the side surface is removed between the first step and the second step.

2. A method of manufacturing a damascene wiring structure, comprising:
   the first step, the second step, and the third step of the method of manufacturing a semiconductor substrate according to claim 1, wherein, in the first step, a groove extending along the main surface of the semiconductor substrate is formed as the recess;
   a fourth step of forming an insulating layer having a first portion provided on an inner surface of the groove and a second portion formed integrally with the first portion and provided on the main surface after the third step;
   a fifth step of forming a metal layer on the first portion and the second portion of the insulating layer;
   a sixth step of forming a wiring portion on the metal layer embedded in the groove;
   a seventh step of removing the metal layer and the wiring portion on the second portion so that the second portion of the insulating layer is exposed; and
   an eighth step of forming a cap layer after the seventh step so that the cap layer covers the second portion of the insulating layer, an end portion of the metal layer, and the wiring portion.

3. The method of manufacturing the damascene wiring structure according to claim 2, wherein
   the main surface of the semiconductor substrate is along a (100) plane, and
   in the first step, the groove extending in a direction along a (110) plane is formed.

4. A damascene wiring structure comprising a semiconductor substrate, an insulating layer, a metal layer, a wiring portion, and a cap layer, wherein
   the semiconductor substrate includes a main surface provided with a recess,
   the recess has a bottom surface, a side surface, and an inclined surface,
   the inclined surface is connected to the bottom surface and the side surface between the bottom surface and the side surface, and is inclined with respect to the bottom surface and the side surface so as to form an obtuse angle with the bottom surface and the side surface, and
   a plane orientation of the bottom surface, a plane orientation of the side surface, and a plane orientation of the inclined surface are different from each other,
   the recess is a groove extending along the main surface,
   the insulating layer has a first portion provided on an inner surface of the groove and a second portion formed integrally with the first portion and provided on the main surface,
   the metal layer is provided on the first portion of the insulating layer,
   the wiring portion is formed on the metal layer embedded in the groove, and
   the cap layer is provided so as to cover the second portion of the insulating layer, an end of the metal layer, and the wiring portion.

5. The damascene wiring structure according to claim 4, wherein
   the bottom surface is a surface along a (100) plane,
   the side surface is a surface along a (110) plane, and
   the inclined surface is a surface along a (111) plane.

6. The damascene wiring structure according to claim 4, wherein
   the recess includes a first groove extending in a first direction along the main surface and a second groove sharing the bottom surface with the first groove and extending in a second direction along the main surface intersecting the first direction,
   the first groove has:
     a first side surface; and
     a first inclined surface connected to the bottom surface and the first side surface between the bottom surface and the first side surface, and inclined with respect to the bottom surface and the first side surface,
   the second groove has:
     a second side surface; and
     a second inclined surface connected to the bottom surface and the second side surface between the bottom surface and the second side surface, and inclined with respect to the bottom surface and the second side surface,
   an intermediate surface is formed between the first side surface and the second side surface and between the first inclined surface and the second inclined surface,
   the intermediate surface is connected to the first side surface, the second side surface, the first inclined surface, the second inclined surface, and the bottom surface, and
   an angle between the intermediate surface and each of the first side surface and the second side surface is an obtuse angle.

7. The damascene wiring structure according to claim 5, wherein
   the recess includes a first groove extending in a first direction along the main surface and a second groove sharing the bottom surface with the first groove and extending in a second direction along the main surface intersecting the first direction,
   the first groove has:
     a first side surface; and
     a first inclined surface connected to the bottom surface and the first side surface between the bottom surface and the first side surface, and inclined with respect to the bottom surface and the first side surface,
   the second groove has:
     a second side surface; and
     a second inclined surface connected to the bottom surface and the second side surface between the bottom surface and the second side surface, and inclined with respect to the bottom surface and the second side surface, an intermediate surface is formed between the first side surface and the second side surface and between the first inclined surface and the second inclined surface, the intermediate surface is connected to the first side surface, the second side surface, the first inclined surface, the second inclined surface, and the bottom surface, and an angle between the intermediate surface and each of the first side surface and the second side surface is an obtuse angle.

8. The damascene wiring structure according to claim 4, wherein the bottom surface is curved so as to be convex toward a side opposite to an opening side of the groove.

9. The damascene wiring structure according to claim 4, wherein the semiconductor substrate includes a first silicon layer, a second silicon layer, and an intermediate layer disposed between the first silicon layer and the second silicon layer, and the main surface is a surface of the first silicon layer opposite to the intermediate layer.

\* \* \* \* \*